(12) United States Patent
Kamiya et al.

(10) Patent No.: US 8,958,492 B1
(45) Date of Patent: Feb. 17, 2015

(54) DATA TRANSMISSION METHOD, DATA RECEPTION METHOD, DATA MODULATION DEVICE, DATA DEMODULATION DEVICE

(75) Inventors: Norifumi Kamiya, Tokyo (JP); Eisaku Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 54 days.

(21) Appl. No.: 13/513,154

(22) PCT Filed: Dec. 1, 2010

(86) PCT No.: PCT/JP2010/071480
§ 371 (c)(1),
(2), (4) Date: May 31, 2012

(87) PCT Pub. No.: WO2011/068119
PCT Pub. Date: Jun. 9, 2011

(30) Foreign Application Priority Data

Dec. 1, 2009 (JP) .................................. 2009-273461

(51) Int. Cl.
*H04L 5/12* (2006.01)

(52) U.S. Cl.
USPC .......................................... 375/261; 375/286

(58) Field of Classification Search
None
See application file for complete search history.

(56) References Cited

U.S. PATENT DOCUMENTS

| | | | |
|---|---|---|---|
| 4,675,619 A * | 6/1987 | Uchibori et al. ............... | 332/151 |
| 4,855,692 A * | 8/1989 | Kennard et al. ................ | 332/103 |
| 5,081,649 A * | 1/1992 | Kennard ......................... | 375/261 |
| 5,305,352 A * | 4/1994 | Calderbank et al. ........... | 375/261 |
| 5,598,432 A | 1/1997 | Wei | |
| 6,473,878 B1 * | 10/2002 | Wei .................................. | 714/755 |
| 7,920,636 B2 * | 4/2011 | Golitschek Edler Von Elbwart et al. .............................. | 375/261 |
| 8,229,022 B2 * | 7/2012 | Noda et al. ..................... | 375/286 |
| 2002/0023247 A1 * | 2/2002 | Akiyama et al. .............. | 714/758 |
| 2002/0136318 A1 * | 9/2002 | Gorokhov et al. ............ | 375/261 |
| 2005/0254606 A1 * | 11/2005 | Alamouti ....................... | 375/341 |
| 2006/0078062 A1 * | 4/2006 | Pons et al. ..................... | 375/265 |
| 2008/0232510 A1 * | 9/2008 | Golitschek Edler Von Elbwart et al. ............................. | 375/298 |

(Continued)

FOREIGN PATENT DOCUMENTS

| | | |
|---|---|---|
| CN | 101292484 A | 10/2008 |
| JP | 11-17759 A | 1/1999 |

(Continued)

OTHER PUBLICATIONS

Hideki Imai, et al., "A New Multilevel Coding Method Using Error-Correcting Codes", IEEE Transactions on Information Theory, May 1, 1977, pp. 371-377, vol. IT-23, No. 3.

(Continued)

*Primary Examiner* — Leon-Viet Nguyen
(74) *Attorney, Agent, or Firm* — Sughrue Mion, PLLC

(57) ABSTRACT

By using circularly-arranged signal points obtained by rearranging a part of signal points arranged in a rectangular shape or a cross shape, average signal power and peak signal energy are reduced to improve nonlinear distortion characteristics. Provided is a bit mapping method in which an average value of a Hamming distance in terms of a specified lower bit portion between adjacent signal points is small, and a Euclidean distance between signal points at which the lower bit portions assigned thereto coincide with each other becomes maximum. By applying error correction code only to the lower bit portion, a data transmission method excellent in bit error rate characteristics is provided while suppressing a band expansion rate.

40 Claims, 37 Drawing Sheets

(56) References Cited

U.S. PATENT DOCUMENTS

| | | |
|---|---|---|
| 2009/0052576 A1 * | 2/2009 | Golitschek Edler Von Elbwart et al. ............................. 375/298 |
| 2009/0135926 A1 * | 5/2009 | Tsouri et al. .................. 375/260 |
| 2009/0168917 A1 | 7/2009 | Noda et al. |

FOREIGN PATENT DOCUMENTS

| | | | |
|---|---|---|---|
| JP | 2000-69103 A | 3/2000 | |
| JP | 2000315957 A | 11/2000 | |
| JP | 2002-190756 A | 7/2002 | |
| JP | 2005-333545 A | 12/2005 | |
| JP | WO2007/046558 * | 4/2007 | .............. H04L 25/49 |
| JP | 2007-208869 A | 8/2007 | |
| JP | 2008-177644 A | 7/2008 | |
| WO | 2007/046558 A1 | 4/2007 | |

OTHER PUBLICATIONS

E. Eleftheriou, et al., "Low-Density Parity-Check Codes for Digital Subscriber Lines", IEEE International Conference on Communications, Apr. 28, 2002, pp. 1752-1757, vol. 3.

Ungerboeck, Gottfried, "Channel Coding with Multilevel/Phase Signals", IEEE Transactions of Information Theory, Jan. 1982, pp. 55-67, vol. IT-28, No. 1.

Tahara, M., et al., "6GHz 140Mbps Digital Radio System with 256-SSQAM Modulation", IEEE Global Communications Conference, Nov. 15, 1987, , pp. 1495-1500.

Communication dated Apr. 25, 2014 from the State Intellectual Property Office, P.R. China in counterpart Chinese Patent Application No. 201080054629.4.

* cited by examiner

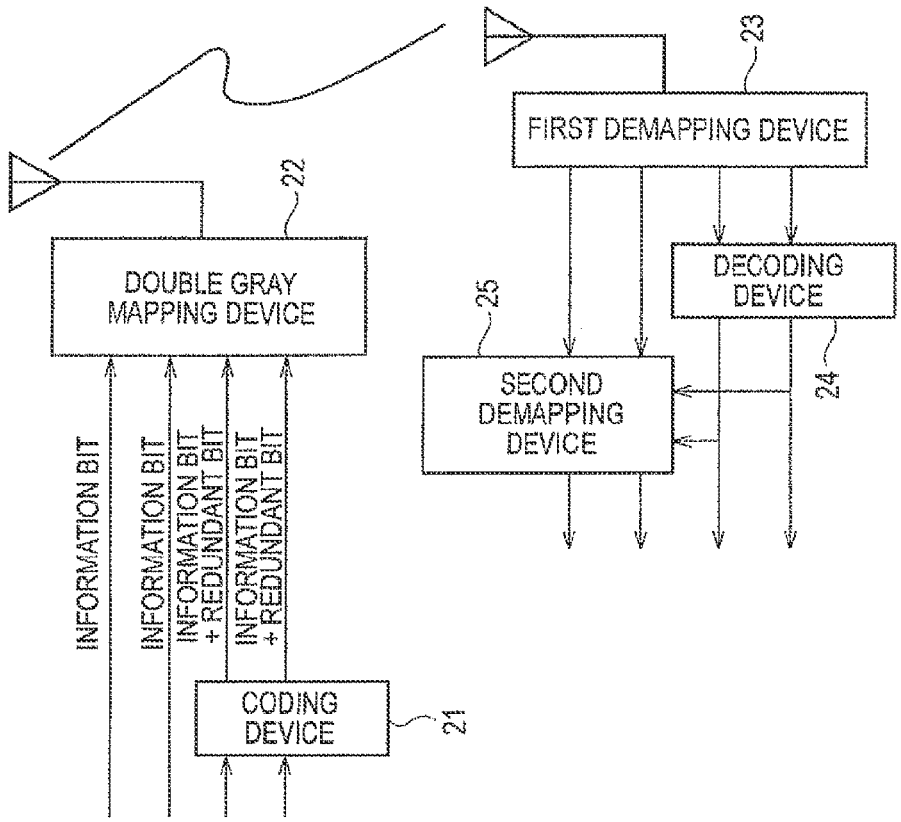
FIG.2
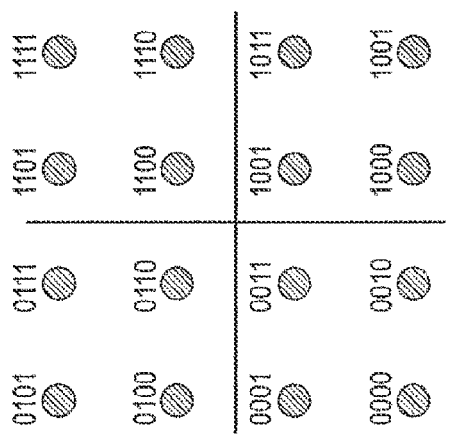

| | 01 | 11 | 10 | 00 | |
|---|---|---|---|---|---|
| 10 | 00 | 10 | 00 | 10 | 11 |
| 00 | 01 | 11 | 01 | 11 | 01 |
| 01 | 00 | 10 | 00 | 10 | 00 |
| 11 | 01 | 11 | 01 | 11 | 10 |
| | 00 | 10 | 11 | 01 | |

5-C-1

| | | | 1 | | |
|---|---|---|---|---|---|
| | | | | | |
| 1 | | | 0 | | 1 |
| | | | | | |
| | | | | | |
| | | | 1 | | |

FIG. 10
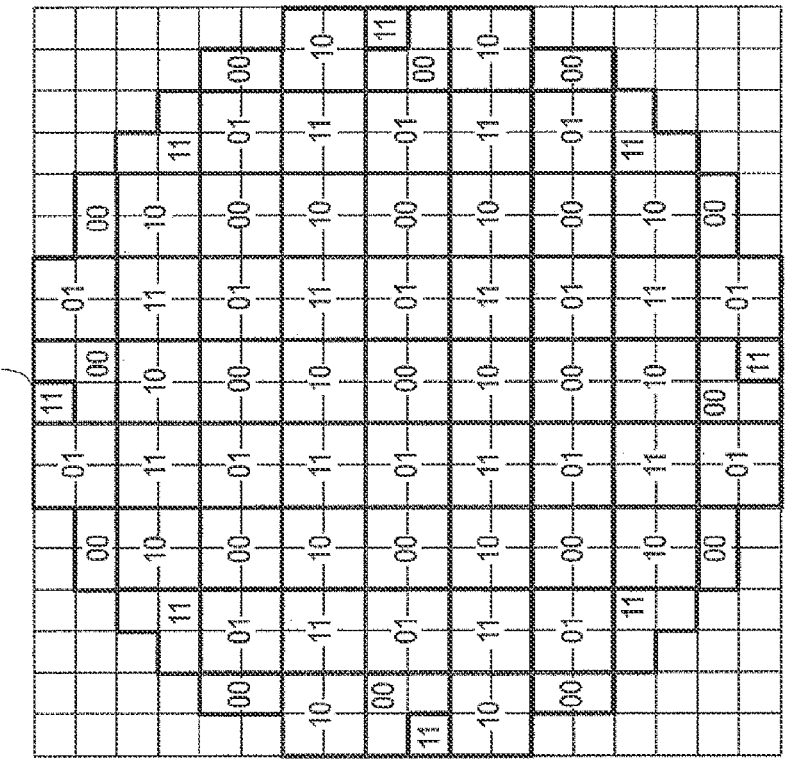
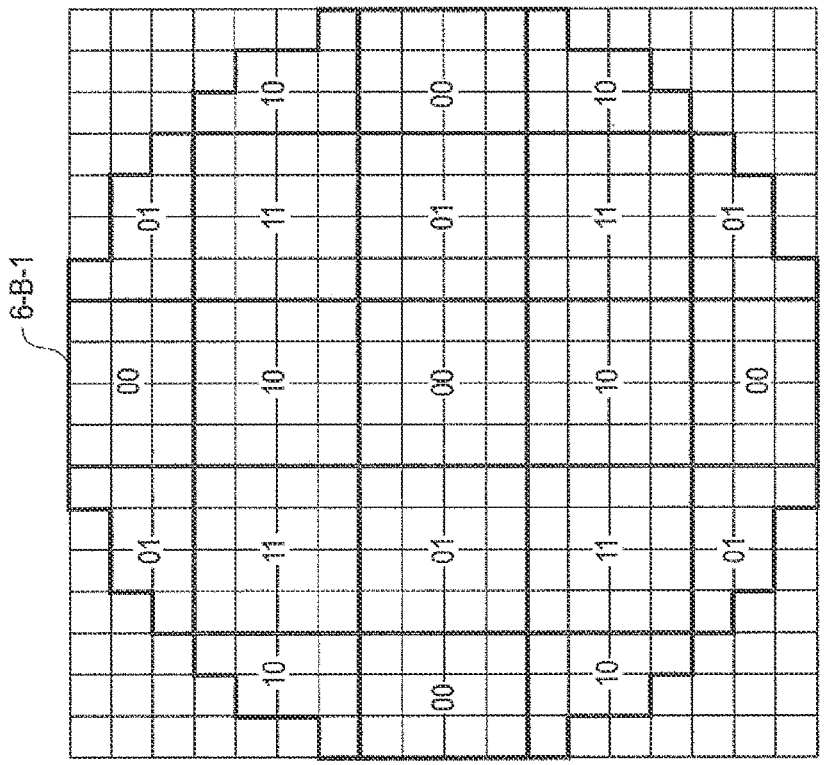

FIG.12

FIG. 13
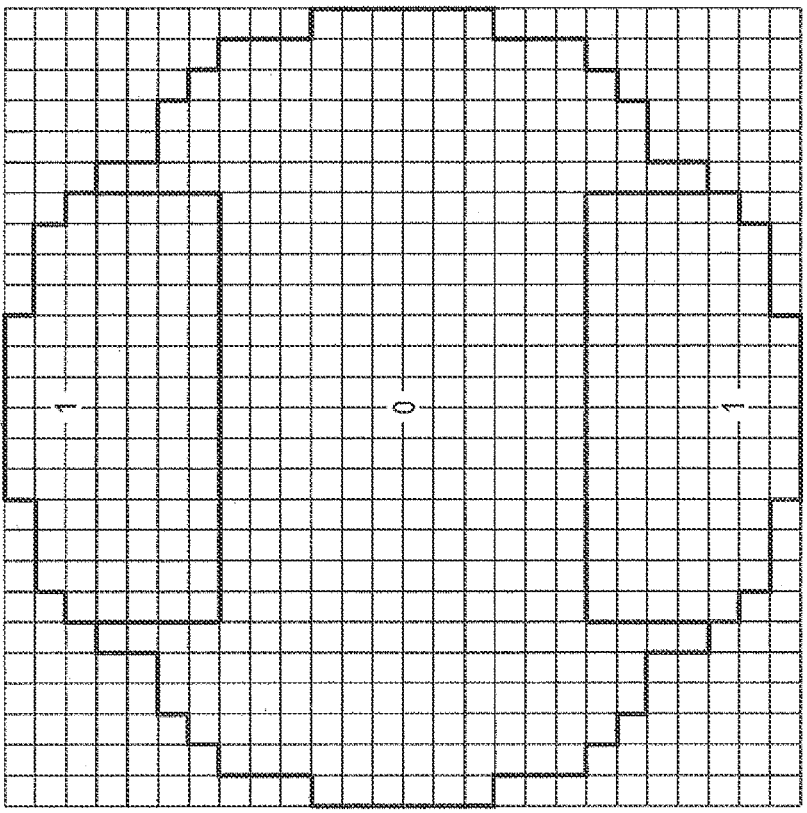
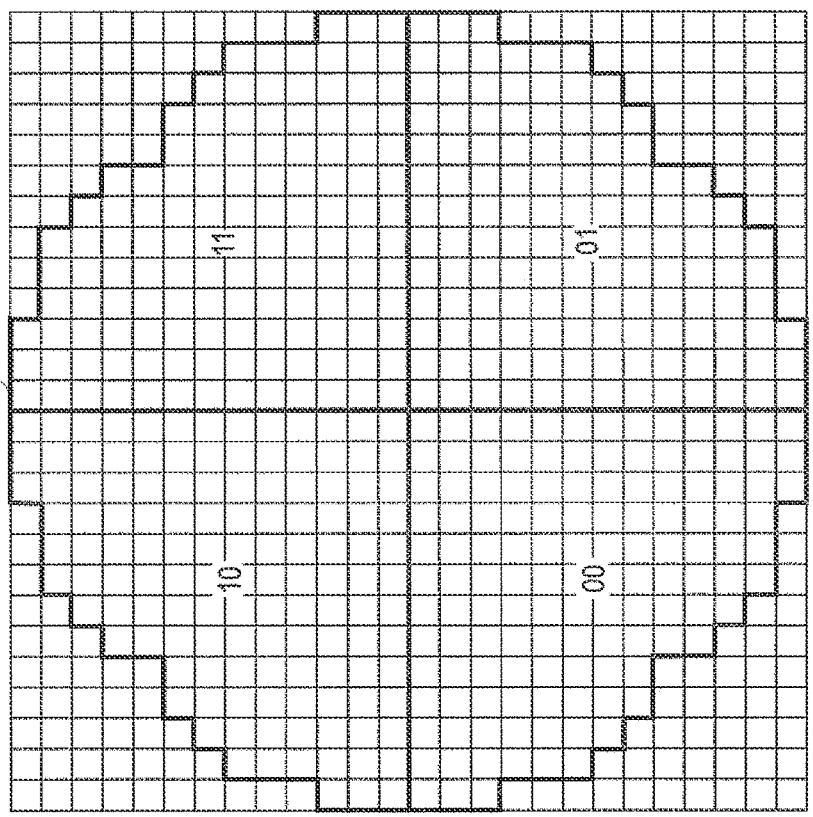

FIG.15

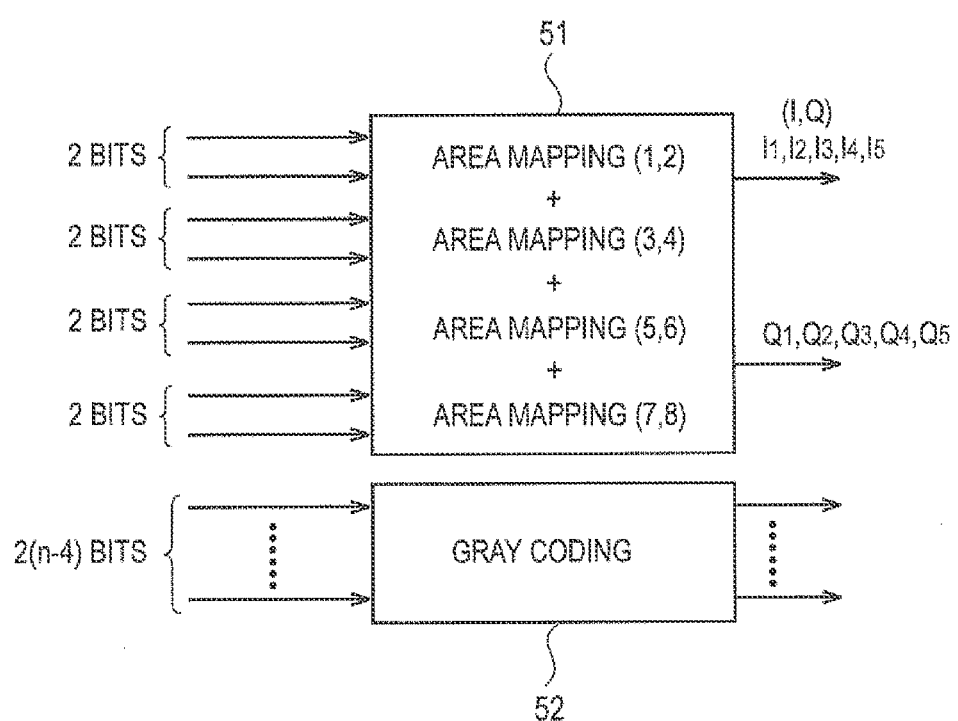

DATA TRANSMISSION METHOD, DATA RECEPTION METHOD, DATA MODULATION DEVICE, DATA DEMODULATION DEVICE

CROSS REFERENCE TO RELATED APPLICATIONS

This application is a National Stage of International Application No. PCT/JP2010/071480, filed on Dec. 1, 2010, which claims priority from Japanese Patent Application No. 2009-273461, filed on Dec. 1, 2009, the contents of all of which are incorporated herein by reference in their entirety.

TECHNICAL FIELD

The present invention relates to a data transmission method, a data reception method, a data modulation device, and a data demodulation device that use a modulation and demodulation scheme to which error correction code has been applied and, more particularly, to a data transmission method, a data reception method, a data modulation device, and a data demodulation device suitably used in a QAM (Quadrature Amplitude Modulation) scheme in which a multi-value number is $2^m$ (m is an integer equal to or larger than 5).

BACKGROUND ART

Conventionally, a $2^m$ QAM (m is a positive integer) modulation and demodulation scheme, such as 64 QAM, 128 QAM, or 256 QAM, has been used in various communication system such as a digital microwave communication system. In the $2^m$ QAM modulation and demodulation scheme, communication is performed through a bit mapping procedure in which $2^m$ m-bit data patterns in total are assigned to $2^m$ signal points.

In order to protect data from noise to be generated in the communication, an error correction code which is redundant data to be added to the communication data to increase error resistance is added. The application of the error correction code generally significantly improves error rate. However, it is known that an effect of the error correction coding differs depending on how to combine the error correction code with the signal point mapping (see, for example, NPLs 1 and 2). In particular, by changing distribution of the redundant bits of the error correction code in consideration of a relationship between a distance among the signal points and a Hamming distance among the m-bit data patterns mapped to respective signal points, the effect of the error correction coding can be increased. This also makes it possible, in a bandwidth-limited communication channel, to suppress band expansion due to the addition of the redundant bits without degrading the error rate.

Hereinafter, to differentiate between the distance among the signal points and the Hamming distance which is the distance among the bit sequences, the former is referred to as "Euclidean distance".

FIGS. 1 and 2 each illustrate an example of a related art in which the error correction code such as a Reed-Solomon code (RS code) or a low-density parity-check code (LDPC code) is applied to a 16 QAM modulation scheme so as to perform data communication.

FIG. 1 illustrates application of gray mapping in which 4 bits are mapped to 16 signal points in such a way that the Hamming distance between bit sequences of adjacent signal points is 1. A transmitting side divides data that has been subjected to error correction coding by a coding device 11 into 4-bit segments, calculates a corresponding signal point through a gray mapping device 12, and transmits a transmission signal. A receiving side selects, from a reception signal, a signal point closest to the calculated signal point in terms of the Euclidean distance and performs, using a decoding device 14, decoding of the error correction code for a bit string obtained through a demapping device 13 that leads to 4 bits corresponding to the selected signal point.

However, a case may occur where the signal point selected by the receiving side differs from the transmitted signal point due to communication channel noise. In this case, a bit error occurs as a result of the demapping. A main factor of the occurrence of the error in a communication system is thermal noise whose amplitude obeys normal distribution, and a signal point which is closer to the transmitted signal point in terms of the Euclidean distance has a higher probability of being selected by the receiving side. Therefore, in a case where the Hamming distance between adjacent signal points that are likely to be erroneously selected due to the thermal noise is large, bit error rate with respect to the same noise level becomes higher. The gray mapping in which the Humming distance between all the adjacent signal points is 1 is an optimum scheme in this sense. However, from a viewpoint of effective application of the error correction code, it is not always necessary that the error correction coding is evenly applied to all the 4 bits that have been mapped to the signal point but the same effect may be obtained by applying the error correction coding to only a part of the 4 bits.

FIG. 2 illustrates a data communication scheme in which 4-bit mapping to the 16 signal points of the 16 QAM is modified. That is, in this scheme, error correction code is applied only to the lower 2 bits.

In this bit mapping, although the Hamming distance between the adjacent signal points is not necessarily 1, the Hamming distance between the adjacent signal points is 1 in terms of only the lower 2 bits, and the Euclidean distance between the signal points at which the lower 2-bit portions assigned thereto coincide with each other is largest.

On a transmitting side, the coding device 21 assigns a bit string that has been subjected to the error correction coding to the lower 2 bits, calculates the corresponding signal point through a double gray mapping device 22 as illustrated in FIG. 2, and transmits a transmission signal. On a receiving side, a first demapping device 23 selects, from a reception signal, a signal point closest to the calculated signal point in terms of the Euclidean distance and a decoding device 24 performs decoding of the error correction code for the lower 2 bits of the 4 bits corresponding to the selected signal point. Subsequently, a second demapping device 25 is used to select, from four signal points at which the 2 bits obtained through the error correction coding and the lower 2-bit portions assigned thereto coincide with each other, one that is closest to the received signal point in terms of the Euclidean distance so as to determine the undetermined upper 2 bits.

Due to the nature that the signal point which is closer to the transmitted signal point in terms of the Euclidean distance has a higher probability of being selected by the receiving side under the condition that the lower 2 bits are corrected properly through the error correction coding and the fact that the Euclidean distance between the signal points at which the lower 2-bit portions assigned thereto coincide with each other is large, a probability that error occurs in the upper 2 bits becomes significantly low. Thus, it can be said that absence of error correction coding for the upper 2 bits produces substantially no disadvantage. In particular, in a communication channel an increase in the bandwidth of which is limited due to the application of the error correction coding, an equivalent error rate can be achieved with a smaller number of the redundant bits as compared to the method illustrated in FIG. 1, which is very effective. The method of FIG. 2 can be said to one in which the bit mapping is devised to divide the 4 bits corresponding to each of the signal points into a bit portion for which the bit error probability is low and the remaining bit portion for which the bit error probability is high so as to apply the error correction coding to only the bit portion for which the bit error probability is high.

The example of the mapping method illustrated in FIG. 2 is called "double gray mapping" (NPL 3). This method, which applies the gray mapping independently to the upper bit portion to which the error correction coding is not applied and the lower bit portion to which the error correction coding is applied, can be applied to a case where the signal constellation is rectangular but cannot be applied to a $2^{2n+1}$ QAM modulation and demodulation scheme in which the index is odd or a case (NPL 4) where the signal constellation is not rectangular even if the index is even.

Further, also in the gray mapping exemplified in FIG. 1 in which a non-encoded portion is not included but the error correction code is applied to all the bits, in the case where the signal constellation is not rectangular, it is not possible to make the Hamming distance between the bit sequences assigned to the adjacent signal points be 1 in general. With regard to a case where the signal constellation is cross-shaped in the $2^{2n+1}$ QAM in which the index is odd, the method of PTL 1 is known as a mapping method in which the Hamming distance between the adjacent signal points becomes minimum.

Set partitioning is known as a bit mapping method for the signal constellations in different shapes, and a TCM scheme (NPL 2) that encodes the lower bit portion with a trellis code is known as the set partitioning approach. In the set partitioning approach, although the Euclidean distance between the signal points at which the lower bit portions assigned thereto which is to be subjected to encoding coincide with each other is maximum, an average Hamming distance between the adjacent signal points is not taken into consideration, so that the bit error rate of the lower bit portion is high. It follows that this set partitioning can be said to be a mapping method that is inadequate for application to error correction code (e.g, RS code or LDPC code) other than the trellis code supporting the set partitioning applied.

CITATION LIST

Patent Literature

{PTL 1} International Publication Pamphlet No. WO 2007/046558

Non-Patent Literature

{NPL 1} G. Ungerboeck, Channel Coding with Multilevel/phase signals, IEEE Transactions on Information Theory, Jan. 1, 1982, pp 55-67
{NPL 2} H. Imai & S. Hirakawa, A New Multilevel Coding Method using Error-Correcting Codes, IEEE Transactions on Information Theory, May 1, 1977, pp 371-377
{NPL 3} E. Eleftheriou & S. Olcer, "Low-Density Parity-Check Codes for Digital Subscriber Lines", IEEE International Conference on Communications, Apr. 28, 2002, pp 1753-1757
{NPL 4} H. Tahara, T. Deguchi, S. Mizoguchi, Y. Yoshida, 6 GHz 140 Mbps Digital Radio System with 256-SSQAM Modulation, IEEE Global Communications Conference, Nov. 15, 1987, pp 1495-1500

SUMMARY OF INVENTION

Technical Problem

With regard to the signal constellation in which the average value of the Hamming distance between the adjacent signal points in terms of a lower s-bit portion (s is a positive integer smaller than m) is small and the lower s-bit portions of the adjacent signal points coincide with each other in the $2^m$QAM scheme that uses the signal points arranged in an arbitrary shape to transmit m-bit data, it is possible to provide a data communication method capable of suppressing an increase in transmission bandwidth and excellent in error rate characteristics by performing the bit mapping by which the Euclidean distance between the signal points is maximized, especially, by applying the error correction code to the lower s-bit portion. However, as described in the "Background Art", such a mapping method has not yet been proposed, excluding a case where the signal points are arranged in a rectangular shape. The bit mapping method based on the set partitioning is a bit mapping in which the Euclidean distance between the signal points at which the lower s-bit portions assigned thereto coincide with each other becomes maximum. However, since the average Hamming distance between the adjacent signal points in terms of the lower s-bit portion is not small, requirements are not met.

Object of the Invention

The present invention has been made in view of the above technical problems, and an exemplary object of the present invention is to provide a bit mapping method in which the average value of the Hamming distance between the adjacent signal points in terms of the lower-bit portion is small and in which the Euclidean distance between the signal points at which the lower-bit portions assigned thereto coincide with each other is large in cases where the signal constellation is cross-shaped and where the signal constellation is circular-shaped obtained by rearranging a part of the signal points arranged in rectangular shape or the cross shape in order to raise average power and peak power, and to provide a data communication method using the above bit mapping method. The circular arrangement of the signal constellation can reduce peak energy as compared to the rectangular arrangement and accordingly allows a communication method excellent in nonlinear distortion characteristics to be achieved.

Solution to Problem

According to a first exemplary data transmission method of the present invention, there is provided a data transmission method of a $2^{2n}$ (n is a positive integer) QAM modulation scheme in which $2^{2n}$ signal points arranged in a circular shape are used to transmit 2n-bit data, the $2^{2n}$ signal points being obtained by rearranging a part of $2^{2n}$ signal points arranged in a rectangular shape, the method comprising:

a first step of relating a 2n-bit pattern whose lower 2t (t is a positive integer smaller than n) bits and upper 2(n−t) bits have been independently subjected to gray code, to each of the signal points coinciding with the rectangular arrangement; and a second step of relating a 2n-bit pattern to each of the signal points rearranged into the circular shape in such a way that an average Hamming distance between adjacent signal points in terms of a lower 2t-bit portion is minimum and a Euclidean distance between the signal points at which the lower 2t-bit portions assigned thereto coincide with each other is maximum, the 2n-bit pattern being among all 2n-bit patterns excluding the 2n-bit patterns assigned to the signal points coinciding the rectangular arrangement, the signal point which is determined by the second step being transmitted corresponding to the 2n-bit data to be transmitted.

According to a second exemplary data transmission method of the present invention, there is provided a data transmission method of a $2^{2n}$ (n is a positive integer) QAM modulation scheme in which $2^{2n}$ signal points arranged in a circular shape are used to transmit 2n-bit data, the $2^{2n}$ signal points being obtained by rearranging a part of $2^{2n}$ signal points arranged in a rectangular shape, the method comprising:

providing n types of area mapping tables for each dividing a signal area including $2^{2n}$ signal points into a plurality of areas, each assigning 2 bits to the each divided area included in the rectangular arrangement by applying gray code that a Hamming distance between the adjacent areas differs by 1, and each assigning 2 bits to each divided area not included in the rectangular arrangement in such a way that an average Hamming distance between the adjacent areas becomes minimum; and dividing the 2n-bit data into n 2-bit data and locating the signal point for the 2n-bit data to a common portion among n signal areas obtained by referring, as to each of the n 2-bit data, to the n area mapping tables among which the divided areas differ in shape.

According to a third exemplary data transmission method of the present invention, there is provided a data transmission method of a $2^{2n+1}$ (n is a positive integer) QAM modulation scheme in which $2^{2n+1}$ signal points arranged in a cross shape are used to transmit 2n+1-bit data, the method comprising:

providing a first mapping table that divides a signal area including $2^{2n+1}$ signal points into a plurality of areas and assigns 2 bits to each divided area in such a way that the bit values differ from each other between adjacent areas and a second area mapping table that divides a signal area including $2^{2n+1}$ signal points into a plurality of areas and assigns 1 bit to each divided area in such a way that the bit value differs from each other between adjacent areas; and dividing 2n+1-bit data into n 2-bit data and one 1-bit data and locating the signal points for the 2n+1-bit data to a common portion between a common portion among n signal areas obtained by referring, as to each of the n 2-bit data, to the n first area mapping tables among which the divided areas differ in shape and an area determined by the second area mapping table in correspondence to the 1-bit data.

According to a fourth exemplary data transmission method of the present invention, there is provided a data transmission method of a $2^{2n+1}$ (n is a positive integer) QAM modulation scheme in which $2^{2n+1}$ signal points arranged in a circular shape are used to transmit 2n+1-bit data, the $2^{2n+1}$ signal points obtained by rearranging a part of $2^{2n+1}$ signal points arranged in a cross shape, the method comprising:

providing a first area mapping table that divides a signal area including $2^{2n+1}$ signal points into a plurality of areas and assigns 2 bits to each divided area in such a way that the bit values differ from each other between adjacent areas and a second area mapping table that divides a signal area including $2^{2n+1}$ signal points into a plurality of areas and assigns 1 bit to each divided area in such a way that the bit value differs from each other between adjacent areas; and dividing 2n+1-bit data into n 2-bit data and one 1-bit data and locating the signal points for the 2n+1 data to a common portion between a common portion among n signal areas obtained by referring, as to each of the n 2-bit data, to the n first area mapping tables among which the divided areas differ in shape and an area determined by the second area mapping table in correspondence to the 1-bit data.

According to a first exemplary data reception method of the present invention, there is a data reception method that uses a $2^{2n}$ (n is a positive integer) QAM modulation scheme in which $2^{2n}$ signal points arranged in a circular shape are used to transmit 2n-bit data, determines a correspondence between the 2n-bit data to be transmitted and the $2^{2n}$ signal points by the data transmission method defined by the method as claimed in claim 2 and calculates, from a received signal point, the 2n-bit data corresponding to a transmitted signal point closest to the received signal point, the method comprising:

acquiring n 2-bit data by referring to n area mapping tables identical to the n area mapping tables as claimed in claim 2 in correspondence to an area including the received signal point.

According to a second exemplary data reception method of the present invention, there is a data reception method that uses a $2^{2n+1}$ (n is a positive integer) QAM modulation scheme in which $2^{2n+1}$ signal points arranged in a cross shape are used to transmit 2n+1-bit data, determines a correspondence between the 2n+1-bit data to be transmitted and the $2^{2n+1}$ signal points by the data transmission method defined by the method as claimed in claim 11 and calculates, from a received signal point, the 2n+1-bit data corresponding to a transmitted signal point closest to the received signal point, the method comprising:

acquiring n 2-bit data by referring to the n 2-bit area mapping tables as claimed in claim 11 in correspondence to an area including the received signal point, and 1 bit by referring to a 1-bit area mapping table.

According to a third exemplary data reception method of the present invention, there is a data reception method that uses a $2^{2n+1}$ (n is a positive integer) QAM modulation scheme in which $2^{2n+1}$ signal points arranged in a circular shape are used to transmit 2n+1-bit data, the $2^{2n+1}$ signal points being obtained by rearranging a part of the $2^{2n+1}$ signal points arranged in a cross shape, determines a correspondence between the 2n+1-bit data to be transmitted and the $2^{2n+1}$ signal points by the data transmission method defined by the method as claimed in claim 14 and calculates, from a received signal point, the 2n+1-bit data corresponding to a transmitted signal point closest to the received signal point, the method comprising:

acquiring n 2-bit data by referring to n 2-bit area mapping tables as claimed in claim 14 in correspondence to an area including the received signal point, and 1 bit by referring to a 1-bit area mapping table.

According to a first exemplary modulation device of the present invention, there is a modulation device of a $2^{2n}$ (n is a positive integer) QAM modulation scheme in which $2^{2n}$ signal points arranged in a circular shape are used to transmit 2n-bit data, the $2^{2n}$ signal points being obtained by rearranging a part of the $2^{2n}$ signal points arranged in a rectangular shape, the device comprising:

a first relating section that relates a 2n-bit pattern whose lower 2t (t is a positive integer smaller than n) bits and upper 2(n−t) bits have been independently subjected to the gray code, to signal points coinciding with the rectangular arrangement; and a second relating section that relates a 2n-bit pattern to each of the signal points rearranged into the circular shape in such a way that an average Hamming distance between the adjacent signal points in terms of the lower 2t-bit portion is minimum and the Euclidean distance between the signal points at which the lower 2t-bit portions assigned thereto coincide with each other is maximum, the 2n-bit pattern being among all 2n-bit patterns excluding the 2n-bit patterns assigned to the signal points coinciding with the rectangular arrangement.

According to a second exemplary modulation device of the present invention, there is a modulation device of a $2^{2n}$ (n is a positive integer) QAM modulation scheme in which $2^{2n}$ signal points arranged in a circular shape are used to transmit 2n-bit data, the $2^{2n}$ signal points being obtained by rearranging a part of the $2^{2n}$ signal points arranged in a rectangular shape, the device comprising:

n types of area mapping tables for each dividing a signal area including $2^{2n}$ signal points into a plurality of areas, each assigning 2 bits to the each divided area included in the rectangular arrangement by applying gray code that a Hamming distance between the adjacent areas differs by 1, and each assigning 2 bits to each divided area not included in the rectangular arrangement in such a way that an average Hamming distance between the adjacent areas becomes minimum; and a setting section that divides the 2n-bit data into n 2-bit data and locates the signal point for the 2n-bit data to a common portion among n signal areas obtained by referring, as to each of the n 2-bit data, to the n area mapping tables among which the divided areas differ in shape.

According to a third exemplary modulation device of the present invention, there is a modulation device of a $2^{2n+1}$ (n is a positive integer) QAM modulation scheme in which $2^{2n+1}$ signal points arranged in a cross shape are used to transmit 2n+1-bit data, the device comprising:

a first area mapping table that divides a signal area including $2^{2n+1}$ signal points into a plurality of areas and assigns 2 bits to each divided area in such a way that the bit values differ from each other between adjacent areas, and a second area mapping table that divides a signal area including $2^{2n+1}$ signal points into a plurality of areas and assigning 1 bit to each divided area in such a way that the bit value differs from each other between adjacent areas; and a setting section that divides 2n+1-bit data into n 2-bit data and one 1-bit data and locates the signal points for the 2n+1-bit data to a common portion between a common portion among n signal areas obtained by referring, as to each of the n 2-bit data, to the n first area mapping tables among which the divided areas differ in shape and an area determined by the second area mapping table in correspondence to the 1-bit data.

According to a fourth exemplary modulation device of the present invention, there is a modulation device of a $2^{2n+1}$ (n is a positive integer) QAM modulation scheme in which $2^{2n+1}$ signal points arranged in a circular shape are used to transmit 2n+1-bit data, the $2^{2n+1}$ signal points obtained by rearranging a part of $2^{2n+1}$ signal points arranged in a cross shape, the device comprising:

a first area mapping table that divides a signal area including $2^{2n+1}$ signal points into a plurality of areas and assigns 2 bits to each divided area in such a way that the bit values differ from each other between adjacent areas, and a second area mapping table that divides a signal area including $2^{2n+1}$ signal points into a plurality of areas and assigns 1 bit to each divided area in such a way that the bit value differs from each other between adjacent areas; and a setting section that divides 2n+1-bit data into n 2-bit data and one 1-bit data and locates the signal points for the 2n+1 data to a common portion between a common portion among n signal areas obtained by referring, as to each of the n 2-bit data, to the n first area mapping tables among which the divided areas differ in shape and an area determined by the second area mapping table in correspondence to the 1-bit data.

According to a first exemplary demodulation device of the present invention, there is a demodulation device that uses a $2^{2n}$ (n is a positive integer) QAM modulation scheme in which $2^{2n}$ signal points arranged in a circular shape are used to transmit 2n-bit data, the device comprising:

a calculation section that determines a correspondence between the 2n-bit data to be transmitted and the $2^{2n}$ signal points by the data transmission method defined by the method as claimed in claim 2 and calculates, from a received signal point, the 2n-bit data corresponding to a transmitted signal point closest to the received signal point; and an acquisition section that acquires n 2-bit data by referring to n area mapping tables identical to the n area mapping tables as claimed in claim 2 in correspondence to an area including the received signal point.

According to a second exemplary demodulation device of the present invention, there is a demodulation device that uses a $2^{2n+1}$ (n is a positive integer) QAM modulation scheme in which $2^{2n+1}$ signal points arranged in a cross shape are used to transmit 2n+1-bit data, the device comprising:

a calculation section that, determines a correspondence between the 2n+1-bit data to be transmitted and the $2^{2n+1}$ signal points by the data transmission method defined by the method as claimed in claim 11 and calculates, from a received signal point, the 2n+1-bit data corresponding to a transmitted signal point closest to the received signal point, and an acquisition section that acquires n 2-bit data by referring to n 2-bit area mapping tables as claimed in claim 11 in correspondence to an area including the received signal point, and 1 bit by referring to a 1-bit area mapping table.

According to a third exemplary demodulation device of the present invention, there is a demodulation device that uses a $2^{2n+1}$ (n is a positive integer) QAM modulation scheme in which $2^{2n+1}$ signal points arranged in a circular shape are used to transmit 2n+1-bit data, the $2^{2n+1}$ signal points being obtained by rearranging a part of the $2^{2n+1}$ signal points arranged in a cross shape, the device comprising:

a calculation section that determines a correspondence between the 2n+1-bit data to be transmitted and the $2^{2n+1}$ signal points by the data transmission method defined by the method as claimed in claim 14 and calculates, from a received signal point, the 2n+1-bit data corresponding to a transmitted signal point closest to the received signal point, and an acquisition section that acquires n 2-bit data by referring to n 2-bit area mapping tables as claimed in claim 14 in correspondence to an area including the received signal point, and 1 bit by referring to a 1-bit area mapping table.

Advantageous Effects of Invention

According to the present invention, there can be provided a multivalued data communication method excellent in bit error rate characteristics and the nonlinear distortion characteristics.

BRIEF DESCRIPTION OF DRAWINGS

FIG. 2 A view for explaining another related art (no coding for upper two bits) concerning the 16 QAM data communication.

FIG. 4 A view for explaining division (256 division) of the signal constellation space.

FIG. 6 A view for explaining area division and bit assignment (upper 2 bits).

FIG. 7 A view for explaining area division and bit assignment (third bit, fourth and fifth bits).

FIG. 8 A view for explaining area division and bit assignment (third bit, fourth and fifth bits).

FIG. 10 A view for explaining area division and bit assignment (fifth and sixth bits, seventh and eighth bits).

FIG. 12 A view for explaining area division and bit assignment (fifth and sixth bits).

FIG. 13 A view for explaining area division and bit assignment (first and second bits, third bit).

FIG. 15 A view for explaining area division and bit assignment (eighth and ninth bits).

FIG. 20 A view for explaining a $2^{2n}$ QAM scheme (coding; n≥4).

FIG. 29 A view for explaining area division and bit assignment (ninth and tenth bits).

Figure 32:
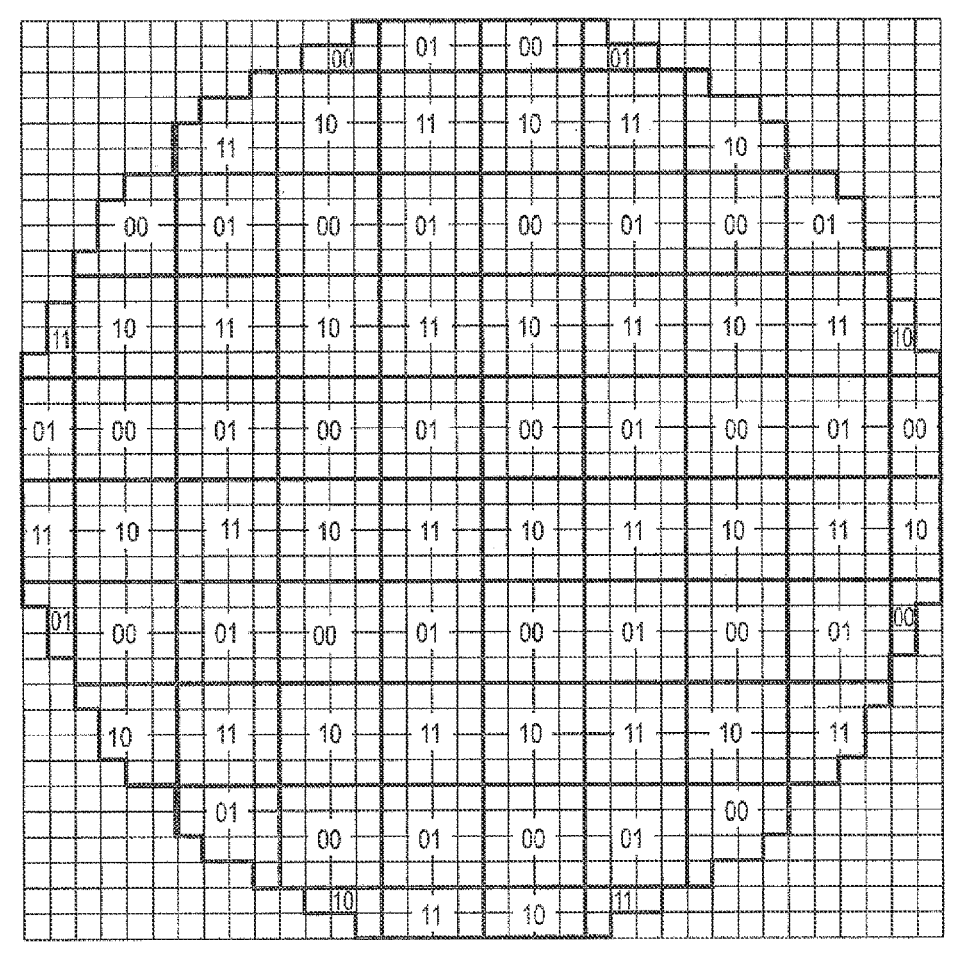

FIG. 32 A view for explaining area division and bit assignment (fifth and sixth bits).

DESCRIPTION OF EMBODIMENTS

Typical exemplary embodiments of the present invention will be described in detail below with reference to the accompanying drawings.

First Embodiment

Explanation of Configuration

Figure 3:
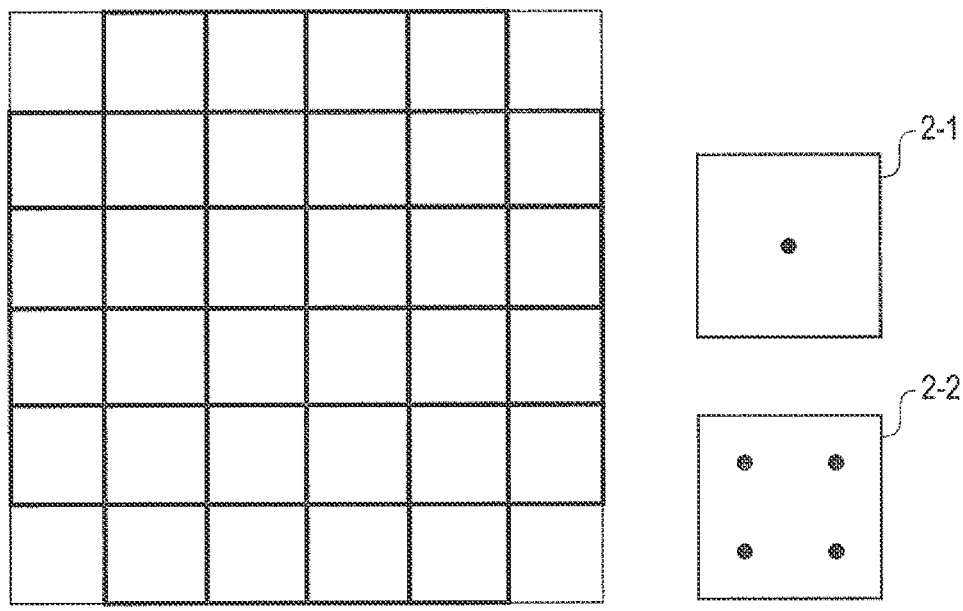
FIG. 3 A view for explaining division (32 division) of a signal constellation space.
Figure 4:
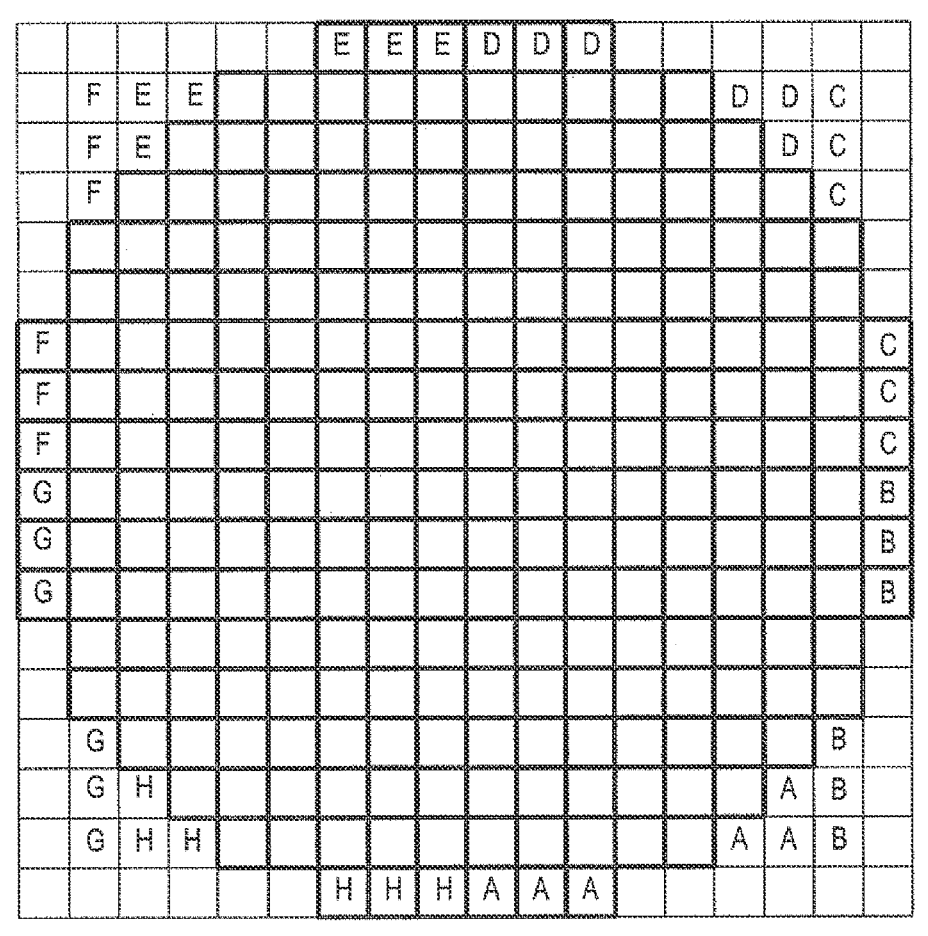
Figure 5:
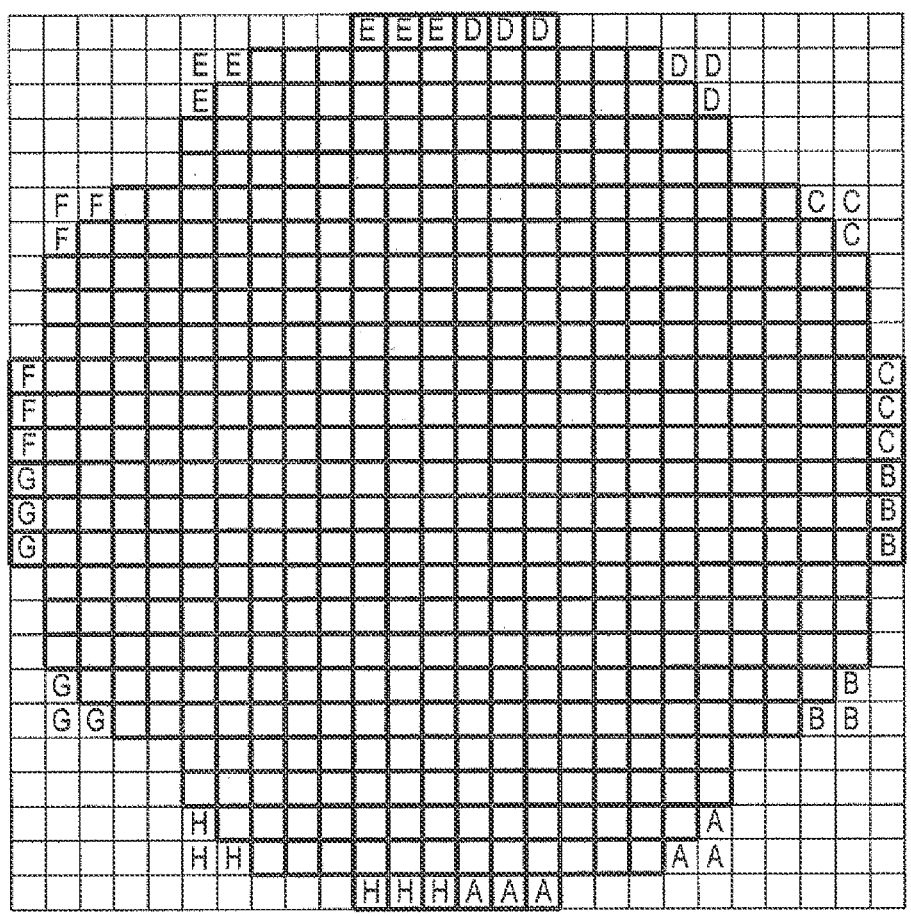
FIG. 5 A view for explaining division (512 division) of a signal constellation space.

FIGS. 3, 4, and 5 are diagrams in which a signal area is divided into 32 areas (FIG. 3), a signal area is divided into 256 areas (FIG. 4), and a signal area is divided into 512 areas (FIG. 5). It is assumed that $2^g$ (g is an even number equal to or larger than 0, i.e., g=0, 2, 4, . . . ) signal points are arranged in one cell (denoted by one square in FIGS. 3, 4, and 5). FIG. 3 illustrates an example in which one ($=2^0$) signal point (one signal point in area 2-1 in the drawing) is arranged in one square or in which four ($=2^2$) signal points (four signal points in area 2-2 in the drawing) are arranged in one square. FIG. 3 represents a 32-QAM cross signal constellation divided into 32 areas when the number of signal points in one square is 1, and represents a 128-QAM cross signal constellation divided into 32 areas when the number of signal points in one square is 4.

First, a mapping method of the 32 QAM signal constellation will be described. In the 32 QAM scheme, 5-bit data to be transmitted is divided into 2-bit+1-bit+2-bit, and the obtained 2-bit, 1-bit, and 2-bit are related to the subdivided signal areas, respectively. A subdivision method of the signal area and a method of creating an area mapping table specifying bit assignment to the subdivided area are as follows.

Figure 6:
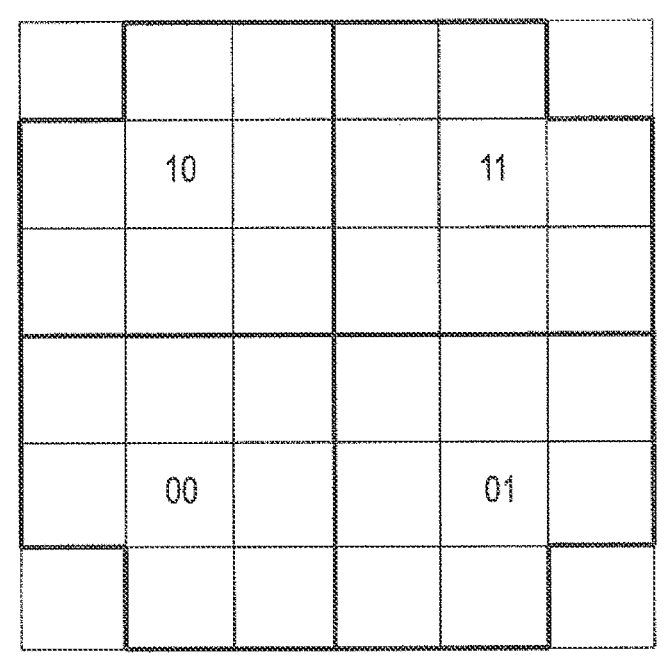
Figure 7:
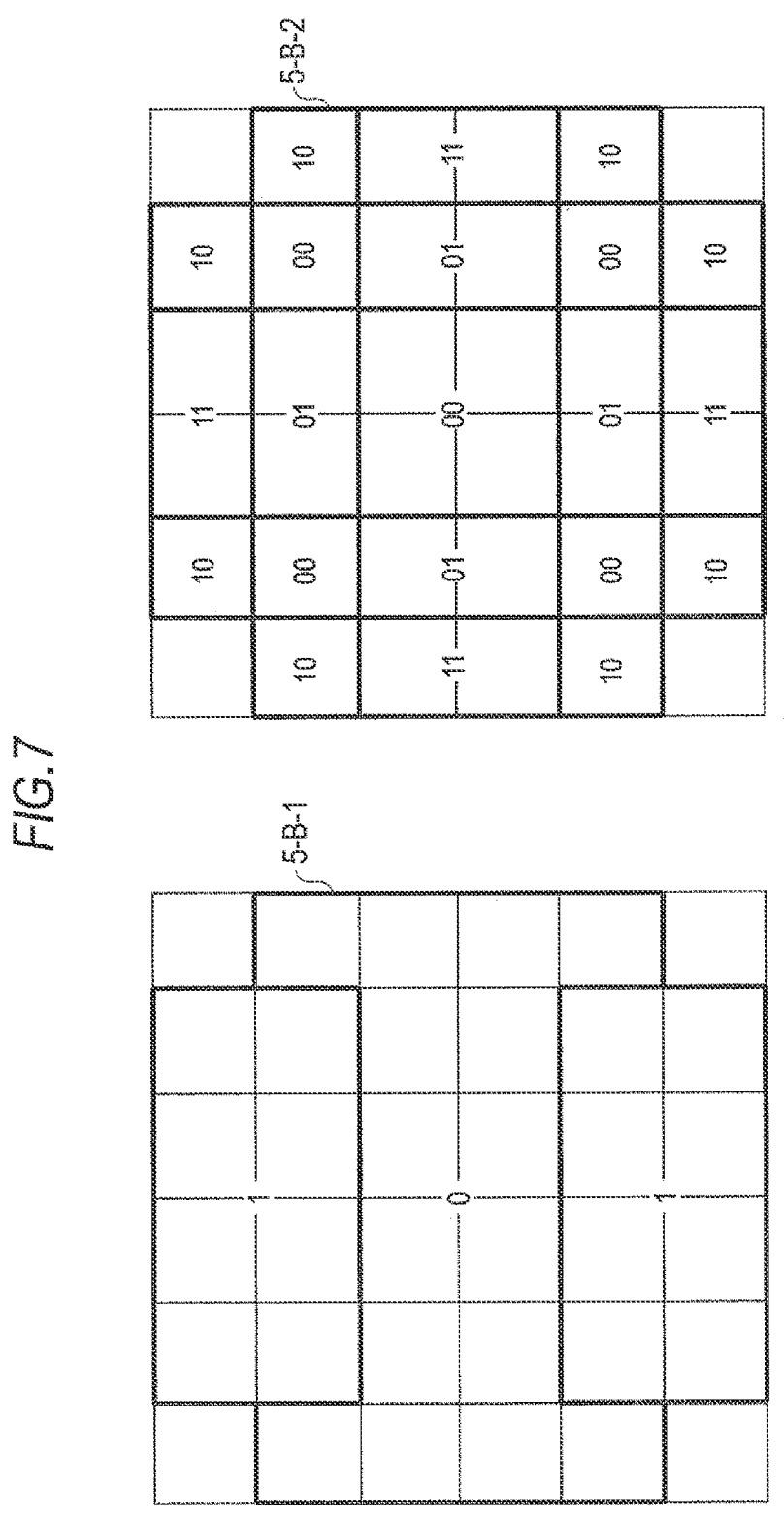

In order to reduce bit error rate for the 5-bit data to be transmitted, it is necessary to reduce the average Hamming distance between the adjacent signal points. In this case, the signal area for the upper 2 bits (first and second bits) is determined using FIG. 6. In FIG. 6, the signal area is divided into four quadrants (first quadrant: "11", second quadrant: "10", third quadrant: "00", fourth quadrant: "01"). Tables 29 and 69 are identical to the table of FIG. 6. FIG. 7 illustrates the signal areas for the third bit (left) and the fourth and fifth bits (right). Both in FIGS. 6 and 7, the Hamming distance between the adjacent areas is 1. Selection of the areas for the third bit and fourth and fifth bits using FIG. 7 results in selection of one of the 32 areas illustrated in FIG. 3 for the 5-bit data to be transmitted. In a case where the 5-bit data is assigned to 32 signal points by using FIGS. 6 and 7, the average Hamming distance between the adjacent signal points becomes minimum as in the case of Patent Literature 1, so that a mapping method superior in bit error rate characteristics can be achieved.

Next, focusing on the lower 3 bits, there will be described a mapping method in which the average Hamming distance between the adjacent signal points in terms of the lower 3-bit portion is small and the Euclidean distance between the signal points at which the lower 3-bit portions assigned thereto coincide with each other is large.

In the mapping method according to FIGS. 6 and 7, the Euclidean distance among four signal points at which the lower bits are e.g., 000 assigned thereto coincides with a Euclidean distance $\Delta$ between the adjacent signal points and thus becomes minimum, so that requirements are not met. In this case, the signal area for the upper 2 bits is determined using FIG. 6, and then the signal area for the lower 3 bits is determined using FIG. 8. As in the case of FIG. 7, 1-bit or 2-bit mapped to each area has a Hamming distance of 1 between the adjacent areas. Selection of the areas for the third bit (5-C-1) and fourth and fifth bits (5-C-2) using FIG. 8 results in selection of one of the 32 areas illustrated in FIG. 3 for the 5-bit data to be transmitted. Tables 31 and 71 are identical to Table 5-C-1 of FIG. 8, and Tables 30 and 70 are identical to Table 5-C-2 of FIG. 8. In terms of the lower 3 bits, when the 5-bit data is assigned to 32 signal points using FIGS. 6 and 8, the average Hamming distance between the adjacent signal points becomes slightly larger than the case using FIGS. 6 and 7; however, the Euclidean distance between the signal points at which the lower 3-bit portions assigned thereto coincide with each other becomes $2\Delta$ or larger ($(\sqrt{10})\Delta$ or larger when the third bit is 1), thus achieving significant improvement.

In a case where the four signal points are included in each divided area, FIG. 3 represents a 128 QAM scheme in which 7-bit data transmission is performed. Also in this case, the mapping method of the upper 5 bits is entirely the same as the above-described 32 QAM. That is, the gray mapping is applied to the remaining lower 2-bits.

The following describes a mapping method for a circularly-arranged 256 signal points of FIG. 4. In a case where four signal points are disposed in each one square, FIG. 4 represents a 1024 QAM.

Generally, in a 256 QAM or 1024 QAM scheme, the signal points are arranged in a rectangular shape. In a case where the signal constellation is rectangular, an optimum mapping can be achieved by the gray mapping or double gray mapping (NPL 3) as described in the "Background Art".

However, the use of the circular signal constellation allows a reduction of the peak energy, which advantageously improves nonlinear distortion characteristics. In the circular signal constellation of FIG. 4, the signal points marked "A" within the constellation area are moved to portions marked "A" outside the constellation area and, similarly, the signal points marked "B" to "H" within the constellation area are moved to portions marked "B" to "H" outside the constellation area, whereby a rectangular constellation can be obtained. In this manner, the circular signal constellation can be obtained by moving a part of the signal points in the rectangular constellation.

8-bit data to be transmitted by the 256 QAM scheme is divided into 2-bit+2-bit+2-bit+2-bit, and the obtained 2-bit, 2-bit, 2-bit, and 2-bit are related to the subdivided signal areas, respectively. The subdivision method of the signal area and method of creating an area mapping table specifying bit assignment to the subdivided area are as follows.

Figure 9:
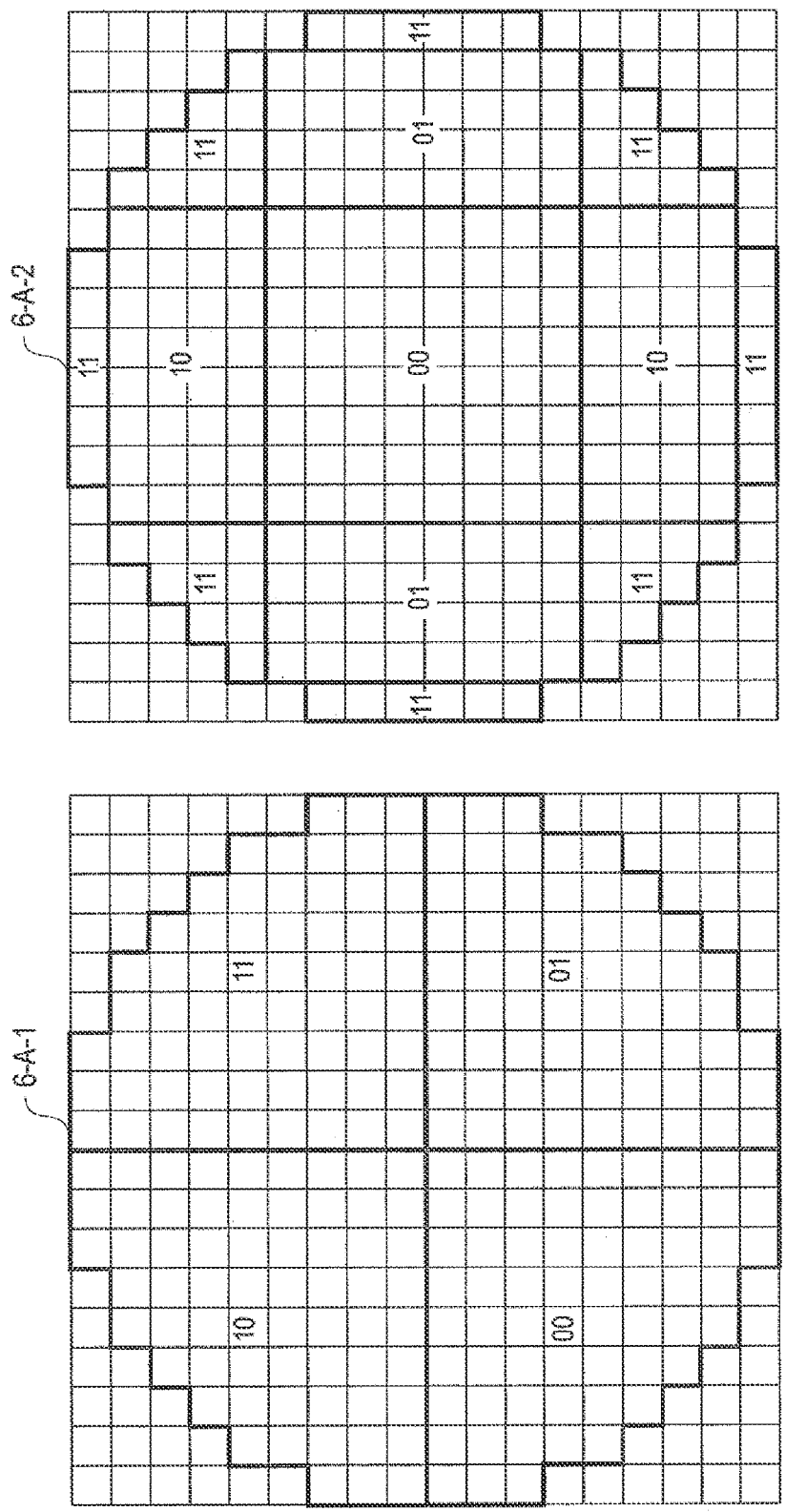
FIG. 9 A view for explaining area division and bit assignment (first and second bits, third and fourth bits).

First, the signal area for the upper 2 bits (first and second bits) is determined using 6-A-1 of FIG. 9. In 6-A-1 of FIG. 9, the signal area is divided into four quadrants (first quadrant: 11, second quadrant: 10, third quadrant: 00, fourth quadrant: 01). Then, 6-A-2 of FIG. 9 is used to select the signal area for third and fourth bits. Tables 2 and 42 are identical to Table 6-A-1 of FIG. 9, and Tables 3, 11, 43, and 51 are identical to Table 6-A-2 of FIG. 9. Similarly, the signal areas for the fifth and sixth bits, and seventh and eighth bits are selected based on the area division views illustrated in 6-B-1 and 6-B-2 of FIG. 10, respectively. Finally, one of the 256 areas of FIG. 4 is selected as a common portion among the selected four areas. Tables 4, 8, 44, and 48 are identical to Table 6-B-1 of FIG. 10, and Tables 5, 9, 13, 45, 49 and 53 are identical to Table 6-B-2 of FIG. 10. In a case where the 8-bit data is assigned to 256 signal points using FIGS. 9 and 10 as described above, the average Hamming distance between the adjacent signal points becomes small, so that a mapping method superior in bit error rate characteristics can be achieved. Unlike the case of the rectangular constellation, the gray mapping cannot be applied to the circular signal constellation in general, so that the average Hamming distance becomes larger than 1. In the case where the four signal points are included in each divided area, FIG. 4 represents a 1024 QAM scheme in which 10-bit data transmission is performed. Also in this case, the mapping method of the upper 8 bits is entirely the same as the above-described 256 QAM. That is, the gray mapping is applied to the remaining lower 2-bits.

Figure 11:
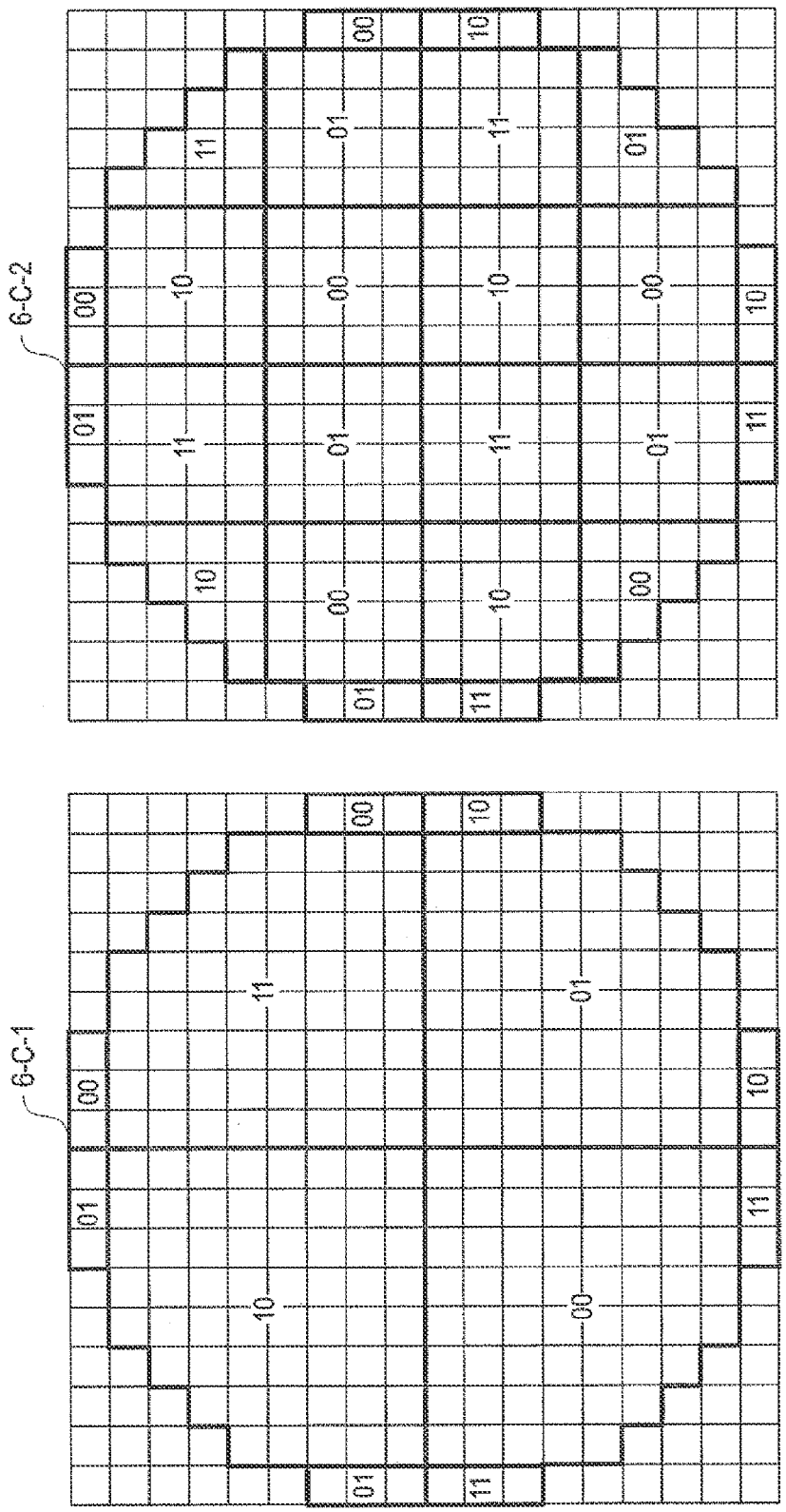
FIG. 11 A view for explaining area division and bit assignment (first and second bits, third and fourth bits).

Next, focusing on the lower 6 bits, there will be described a mapping method in which the average Hamming distance between the adjacent signal points in terms of the lower 6-bit portion is small and the Euclidean distance between the signal points at which the lower 6-bit portions assigned thereto coincide with each other is large. In the mapping method according to FIGS. 9 and 10, the Euclidean distance among four signal points at which the lower 6 bits are e.g., 000000 assigned thereto coincides with the Euclidean distance $\Delta$ between the adjacent signal points and thus becomes minimum, so that requirements are not met. In this case, the signal area for the upper 2 bits (first and second bits) is determined using 6-C-1 of FIG. 11, and then the signal area for the third and fourth bits is determined using 6-C-2 of FIG. 11. Tables 6, 10, 46 and 50 are identical to Table 6-C-1 of FIG. 11, and Tables 7 and 47 are identical to Table 6-C-2 of FIG. 11. The signal areas for the fifth, sixth, seventh, and eighth bits are determined using FIG. 10 as in the above case. Also in a case where the signal areas for the first and second bits and third and fourth bits are selected using FIG. 11 in place of FIG. 9, one of the 256 areas illustrated in FIG. 4 is selected. In terms of the lower 6 bits, when the 8-bit data is assigned to 256 signal points using FIGS. 10 and 11, the average Hamming distance between the adjacent signal points becomes slightly larger than the case using FIGS. 6 and 7; however, the Euclidean distance between the signal points at which the lower 6-bit portions assigned thereto coincide with each other becomes ($\sqrt{50}$) Δ or larger, thus achieving significant improvement. "$\sqrt{50}$" means "the square root of fifty". The application of the error correction code only to the lower 6 bits allows a communication device capable of suppressing an increase in transmission bandwidth and excellent in error rate characteristics to be provided.

Figure 12:
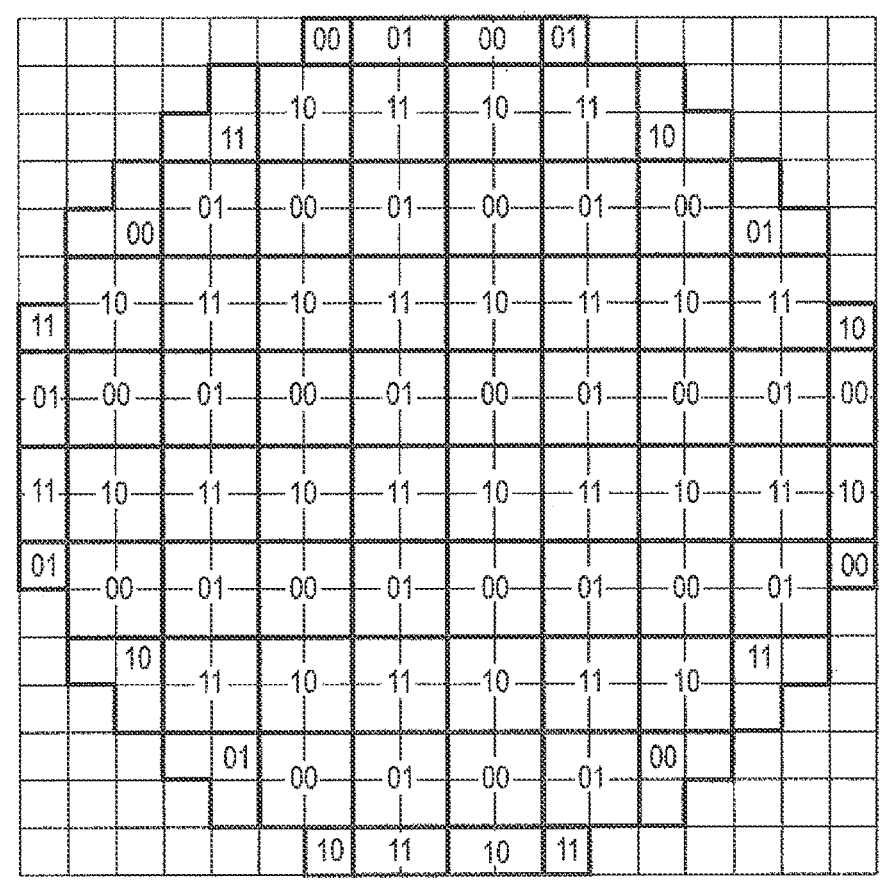

Next, focusing on the lower 4 bits, there will be described a mapping method in which the average Hamming distance between the adjacent signal points in terms of the lower 4-bit portion is small and the Euclidean distance between the signal points at which the lower 4-bit portions assigned thereto coincide with each other is large. In this case, the signal area for the 8 bits to be transmitted is determined as follows. That is, the signal area for the first and second bits is selected using 6-C-1 of FIG. 11, the signal area for the third and fourth bits is selected using 6-A-2 of FIG. 9, the signal area for the fifth and sixth bits is selected using FIG. 12, and the signal area for the seventh and eighth bits is selected using 6-B-2 of FIG. 10. Finally, one of the 256 areas of FIG. 4 is selected as a common portion among all the selected areas. Tables 12 and 52 are identical to the table of FIG. 12. The Euclidean distance between the signal points at which the lower 4-bit portions assigned thereto coincide with each other becomes ($\sqrt{10}$) Δ or larger. In the case where the four signal points are included in each divided area, FIG. 4 represents a 1024 QAM scheme in which 10-bit data transmission is performed. Also in this case, however, the mapping method of the upper 8 bits is entirely the same as the above-described 256 QAM. That is, the gray mapping is applied to the remaining lower 2-bits.

The following describes a mapping method for a circularly-arranged 512 signal points of FIG. 5. In a case where four signal points are disposed in each one square, FIG. 5 represents a 2048 QAM. Generally, in the 512 QAM or 2048 QAM scheme, the signal points can be arranged in a cross shape as described in the description of the 32 QAM and the 128 QAM of FIG. 3. However, the use of the circular signal constellation allows a reduction of the peak energy, which advantageously improves nonlinear distortion characteristics.

In the circular signal constellation of FIG. 5, the signal points marked "A" within the constellation area are moved to portions marked "A" outside the constellation area and, similarly, the signal points marked "B" to "H" within the constellation area are moved to portions marked "B" to "H" outside the constellation area, whereby a cross constellation can be obtained. In this manner, the circular signal constellation can be obtained by moving a part of the signal points in the cross constellation. 9-bit data to be transmitted by the 512 QAM scheme is divided into 2-bit+1-bit+2-bit+2-bit+2-bit, and the obtained 2-bit, 1-bit, 2-bit, 2-bit, and 2-bit are related to the subdivided signal areas, respectively. The subdivision method of the signal area and method of creating an area mapping table specifying bit assignment to the subdivided area are as follows.

First, the signal area for the upper 2 bits (first and second bits) is determined using 7-A-1 of FIG. 13. In 7-A-1 of FIG. 13, the signal area is divided into four quadrants (first quadrant: 11, second quadrant: 10, third quadrant: 00, fourth quadrant: 01). Then, 7-A-2 of FIG. 13 is used to select the signal area for the third bit. Tables 32, 37, 72, and 77 are identical to Table 7-A-1 of FIG. 13, and Tables 41 and 81 are identical to Table 7-A-2 of FIG. 13. Similarly, the signal areas for the fourth and fifth bits and sixth and seventh bits are selected based on the area division views illustrated in 7-B-1 and 7-B-2 of FIG. 14, respectively, and then the signal area for the eighth and ninth bits are selected based on the area division view illustrated in FIG. 15. Tables 38, and 78 are identical to Table 7-B-1 of FIG. 14, and Tables 34, 39, 74, and 79 are identical to Table 7-B-2 of FIG. 14. Tables 35, 40, 75, and 80 are identical to the table of FIG. 15. Finally, one of the 512 areas of FIG. 5 is selected as a common portion among the selected five areas. In a case where the 9-bit data is assigned to 512 signal points using FIGS. 13, 14, and 15 as described above, the average Hamming distance between the adjacent signal points becomes small, so that a mapping method superior in bit error rate characteristics can be achieved. Unlike the case of the rectangular constellation, the gray mapping cannot be applied to the circular signal constellation in general, so that the average Hamming distance becomes larger than 1. In a case where the four signal points are included in each divided area, FIG. 5 represents a 2048 QAM scheme in which 11-bit data transmission is performed. Also in this case, the mapping method of the upper 9 bits is entirely the same as the above-described 512 QAM. That is, the gray mapping is applied to the remaining lower 2-bits.

Next, focusing on the lower 7 bits, there will be described a mapping method in which the average Hamming distance between the adjacent signal points in terms of the lower 7-bit portion is small and the Euclidean distance between the signal points at which the lower 7-bit portions assigned thereto coincide with each other is large. In the mapping method according to FIGS. 13, 14, and 15, the Euclidean distance among four signal points at which the lower 7 bits are e.g., 0000000 assigned thereto coincides with the Euclidean distance Δ between the adjacent signal points and thus becomes minimum, so that requirements are not met. In this case, the signal area for the upper 2 bits (first and second bits) is determined using 7-A-1 of FIG. 13, and the signal areas for the third bit and fourth and fifth bits are determined using 7-D-1 and 7-D-2 of FIG. 16, respectively. Tables 36 and 76 are identical to Table 7-D-1 of FIG. 16, and Tables 33 and 73 are identical to Table 7-D-2 of FIG. 16. The signal area for the sixth and seventh bits is determined using 7-B-2 of FIG. 14 as in the above case, and the signal area for the eighth and ninth bits is determined using FIG. 15. Also in a case where the signal areas for the third bit and fourth and fifth bits are selected using FIG. 16, one of the 512 areas illustrated in FIG. 5 is selected. In terms of the lower 7 bits, when the 9-bit data is assigned to 512 signal points, the average Hamming distance between the adjacent signal points becomes slightly larger than the case using FIGS. 13, 14, and 15; however, the Euclidean distance between the signal points at which the lower 7-bit portions assigned thereto coincide with each other becomes 8Δ or larger, thus achieving significant improvement. The application of the error correction code only to the lower 7 bits allows a communication device capable of suppressing an increase in transmission bandwidth and excellent in error rate characteristics to be provided.

(Explanation of Configuration and Operation)

In the $2^m$ QAM scheme in which the signal area is divided as illustrated in FIG. 3, 4, or 5 and the signal point is arranged in each one square, the constellation point are arranged in a two-dimensional plane, so that the arrangement thereof can be each represented by two numbers. Assuming that the horizontal direction is referred to as I axis and vertical direction is to Q axis and that the lower-left corner of the signal area set as an origin, each signal point can be represented by coordinate values on the I and Q axes. Thus, a device for mapping a bit to each signal point inputs thereto m-bit data to be transmitted and outputs the I and Q axes coordinate values.

Figure 17:
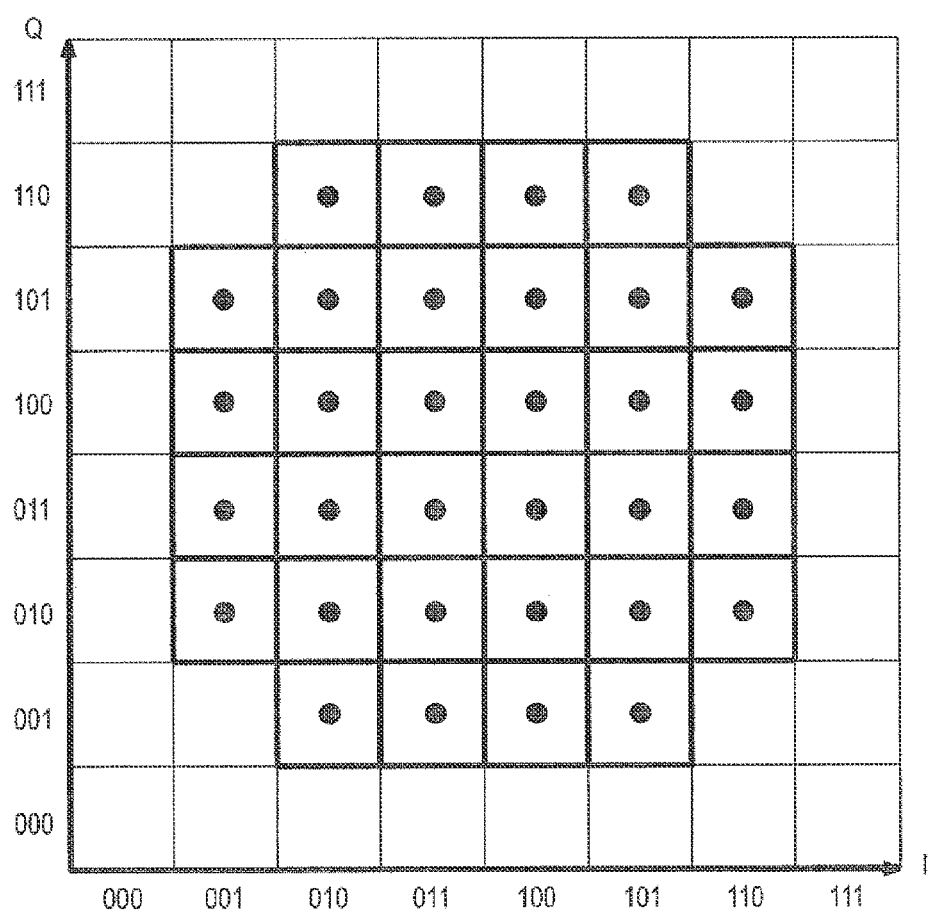
FIG. 17 A view illustrating a relationship between I and Q axes and signal points in a 32 QAM scheme.
Figure 18A:
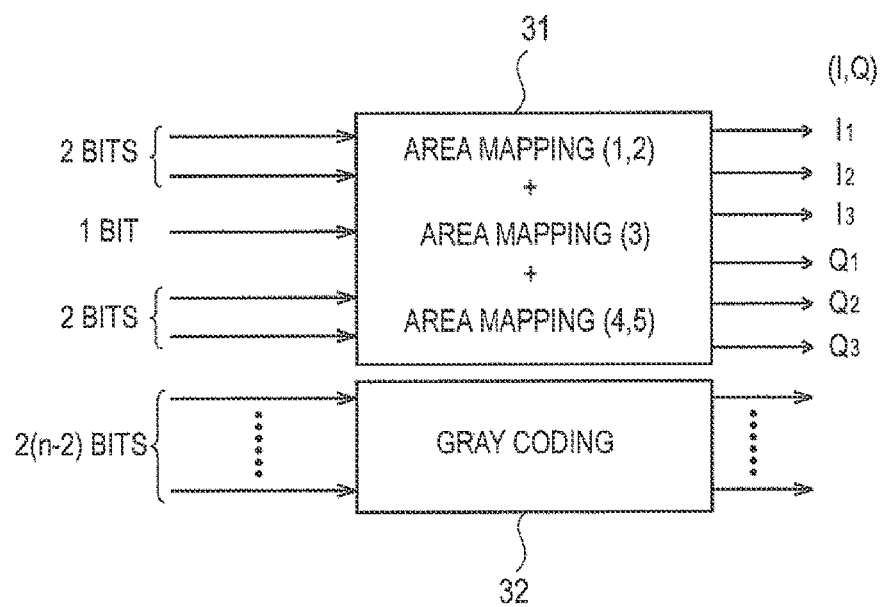
FIGS. 18A and 18B Views for explaining a $2^{2n+1}$ QAM scheme (coding).

FIG. 17 illustrates an example of the 32 QAM signal constellation and I and Q axes coordinate values. FIG. 18A is a block diagram illustrating an example of a $2^{2n+1}$ QAM mapping device (modulation device) that uses the cross signal constellation of FIG. 3 to transmit 2n+1 bit data.

Hereinafter, for simple explanation, n is set to 2, that is, the 32 QAM scheme will be described (FIG. 17). As described above, the gray coding is applied to a lower bit portion, so that the same configuration can be applied to a case where n>2. In the case where n>2, the lower 2 (n−2) bits are subjected to the gray coding by a gray coding device 32 (see FIG. 18A).

In an area mapping table 31, an area mapping table (1, 2) is used to refer to an area corresponding to upper 2 bits (first and second bits) of 5-bit data to be transmitted, an area mapping table (3) is used to refer to an area corresponding to the third bit thereof, and an area mapping table (4, 5) is used to refer to an area corresponding to lower 2 bits thereof. By synthesizing the thus selected areas, the I and Q axes coordinate values for a unique signal point existing in a common portion among the areas are determined.

The area mapping table (1, 2) determines an area corresponding to the input 2 bits using FIG. 6. Referring to FIG. 6, the input bits correspond to the first bit of I axis and first bit of Q axis, which are output from the area mapping table (1, 2). In a case where Table 5-B-1 of FIG. 7 is used as an area mapping table (3), when the input third bit is 1, the second bit of I axis is fixed, while when the input third bit is 0, the second bit of Q axis is fixed. In a case where Table 5-C-1 of FIG. 8 is used for area mapping of the third bit, when the input third bit is 0, the second bits of both I and Q axes are fixed, while when the input third bit is 1, the second bits of neither I nor Q axes are fixed. Finally, the area for the fourth and fifth bits is determined by referring to an area mapping table (4, 5) (5-B-2 of FIG. 7). With the above operation, undetermined bits of I and Q axes are fixed. As a result, the coordinate values (3 bit, 3 bit) of I and Q axes are fixed for the 5-bit data to be transmitted, whereby mapping to the signal points can be performed.

Figure 18B:
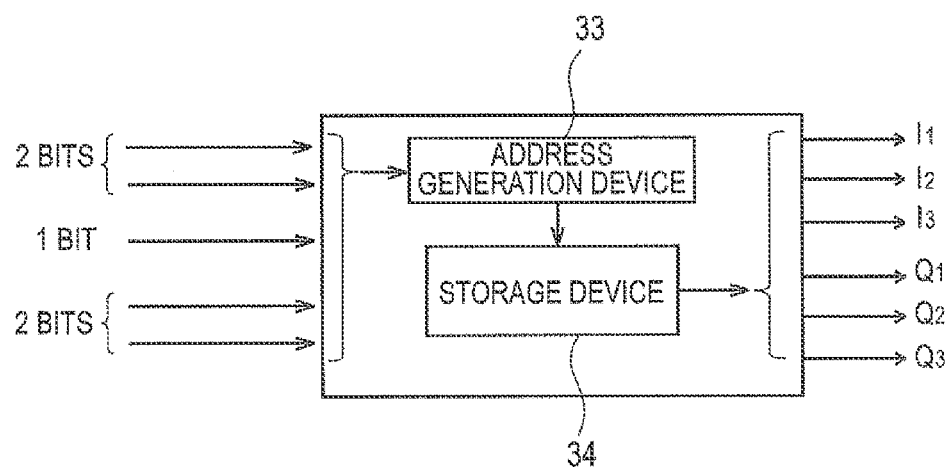

FIG. 18B is a view illustrating a configuration of the area mapping device (modulation device) of FIG. 18A. A storage device 34 is, e.g., a ROM or a RAM for retaining output data. An address generation device 33 generates, from an input bit, an address of a storage device in which output data corresponding to the input bit. Is retained For example, in a case where FIG. 6 (first and second bits) and FIG. 7 (third bit, fourth and fifth bits) are used as the area mapping table, the following table (Table 1) can be generated from the area mapping table. The generated table is stored in the storage device such as the ROM or RAM.

Figure 35:
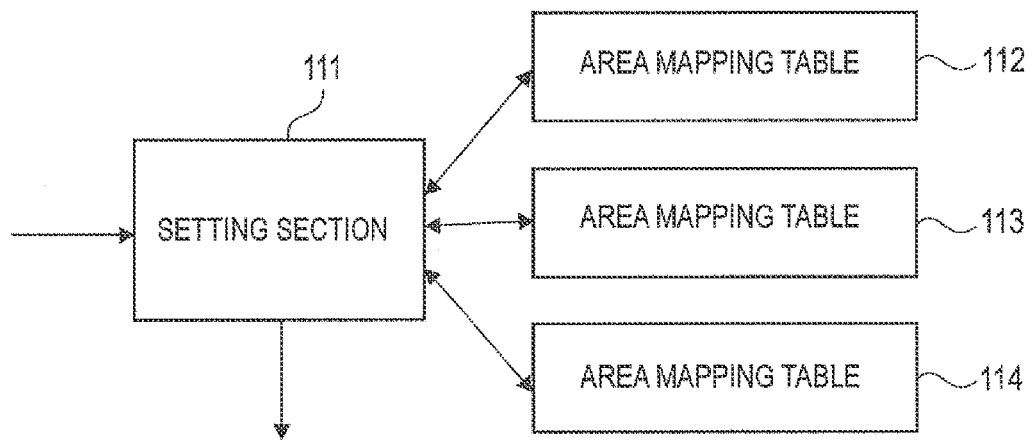
FIG. 35 A block diagram illustrating a configuration example of an address generation device of FIG. 18B.

FIG. 35 is a block diagram illustrating a configuration example of the address generation device 33 of FIG. 18B. The address generation device 33 includes first area mapping tables 112 and 114 that each divide the signal area including 32 signal points into a plurality of areas and each assign 2 bits to each divided area in such a way that the bit values differ from each other between adjacent areas, a second area mapping table 113 that divides the signal area including 32 signal points into a plurality of areas and each assign 1 bit to each divided area in such a way that the bit value differs from each other between adjacent areas, and a setting section 111 that divides 5-bit data into two 2-bit data and one 1-bit data and locates the signal point for the 5-bit data to a common portion between a common portion between two signal areas obtained by referring to the two first area mapping tables 112 and 114 among which the divided areas to which the 2-bit data has been assigned differ in shape and an area determined by the second area mapping table 113 in correspondence to the 1-bit data. The area mapping tables 112, 113, and 114 correspond to the area mapping table (1, 2), area mapping table (3), and area mapping table (4, 5) of FIG. 18A, respectively. The setting section 111 includes a storage device such as a ROM or a RAM for storing information of the table (Table 1). The setting section 111 generates, from the input bits, an address of the storage device in which output data corresponding to the input bits is retained.

TABLE 1

| Address | Data I | Data Q |
|---|---|---|
| 00000 | 011 | 011 |
| 00001 | 010 | 011 |
| 00010 | 001 | 010 |
| 00011 | 001 | 011 |
| 00100 | 010 | 010 |
| 00101 | 011 | 010 |
| 00110 | 010 | 001 |
| 00111 | 011 | 001 |
| 01000 | 100 | 011 |
| 01001 | 101 | 011 |
| 01010 | 110 | 010 |
| 01011 | 110 | 011 |
| 01100 | 101 | 010 |
| 01101 | 100 | 010 |
| 01110 | 101 | 001 |
| 01111 | 100 | 001 |
| 10000 | 011 | 100 |
| 10001 | 010 | 100 |
| 10010 | 001 | 101 |
| 10011 | 001 | 100 |
| 10100 | 010 | 101 |
| 10101 | 011 | 101 |
| 10110 | 010 | 110 |
| 10111 | 011 | 110 |
| 11000 | 100 | 100 |
| 11001 | 101 | 100 |
| 11010 | 110 | 101 |
| 11011 | 110 | 100 |
| 11100 | 101 | 101 |
| 11101 | 100 | 101 |
| 11110 | 101 | 110 |
| 11111 | 100 | 110 |

In Table 1, the address value corresponds to the input bits, so that the address generation device uses the input bits as the address to specify data I (3 bits) and data Q (3 bits) retained in the storage device and outputs the specified data.

The following describes a decoding device that calculates, on the receiving side, the transmitted 5 bits from the received signal point which is a communication channel output in the case of the 32 QAM scheme. In the above-described signal constellation mapping method, the I and Q axes coordinate values of the signal point corresponding to the 5 bits to be transmitted are derived by the area division. On the receiving side, however, the procedure is reversed, that is, the transmitted 5 bits are calculated from the I and Q axes coordinate values.

Figure 19A:
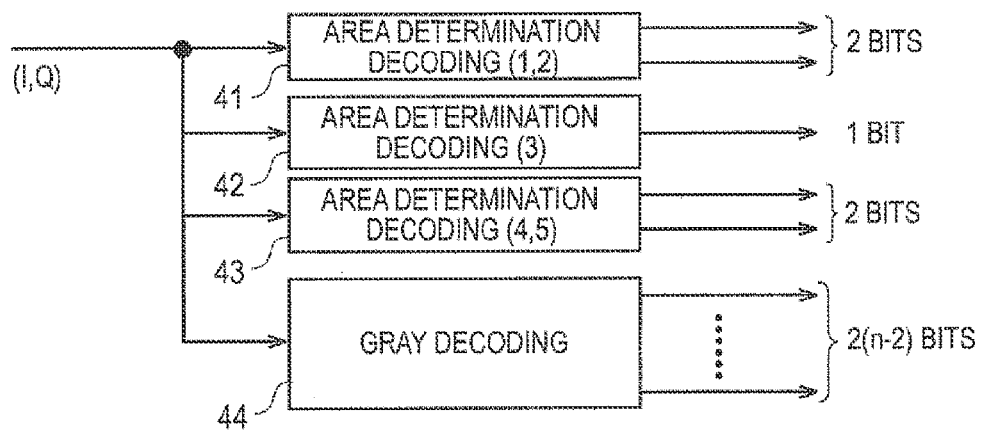
FIGS. 19 A and 19B Views for explaining a $2^{2n+1}$ QAM scheme (decoding).

FIG. 19A is a block diagram illustrating an example of a device (demodulation device) that executes such demapping.

The device of FIG. 19A includes an area determination decoding device (1, 2) 41, an area determination decoding device (3) 42, and an area determination decoding device (4, 5) 43. Each of the area determination decoding devices inputs the I and Q axes coordinate values corresponding to the received signal point of the communication channel output and outputs a bit sequence assigned to an area including the received signal point. The area determination decoding device (1, 2) 43 uses FIG. 6 to output "11" when the received signal point exists in the first quadrant, outputs "10" when the received signal point exists in the second quadrant, "00" when the received signal point exists in the third quadrant, and "11" when the received signal point exists in the fourth quadrant. Similarly, the area determination decoding device (3) 42 uses 5-B-1 of FIG. 7 to output 1 bit assigned to an area in which the received signal constellation exists. In a case where the transmitting side has performed the mapping using FIG. 8 as described above, the area determination decoding device (3) 42 uses 5-C-1 of FIG. 8 to output 1 bit assigned to an area in which the received signal constellation exists. The area determination decoding device (4, 5) 43 uses 5-B-2 of FIG. 7 (or uses 5-C-2 of FIG. 8 in a case where the transmitting side has performed the mapping using 5-C-2 of FIG. 8) to output 1 bit assigned to an area in which the received signal constellation exists. As described above, the bit sequence output from each area determination decoding device is a bit string corresponding to the transmitted signal point closest to the received signal point in terms of the Euclidean distance. A gray decoding device 44 performs gray decoding to output 2 (n−2) bits.

Figure 19B:
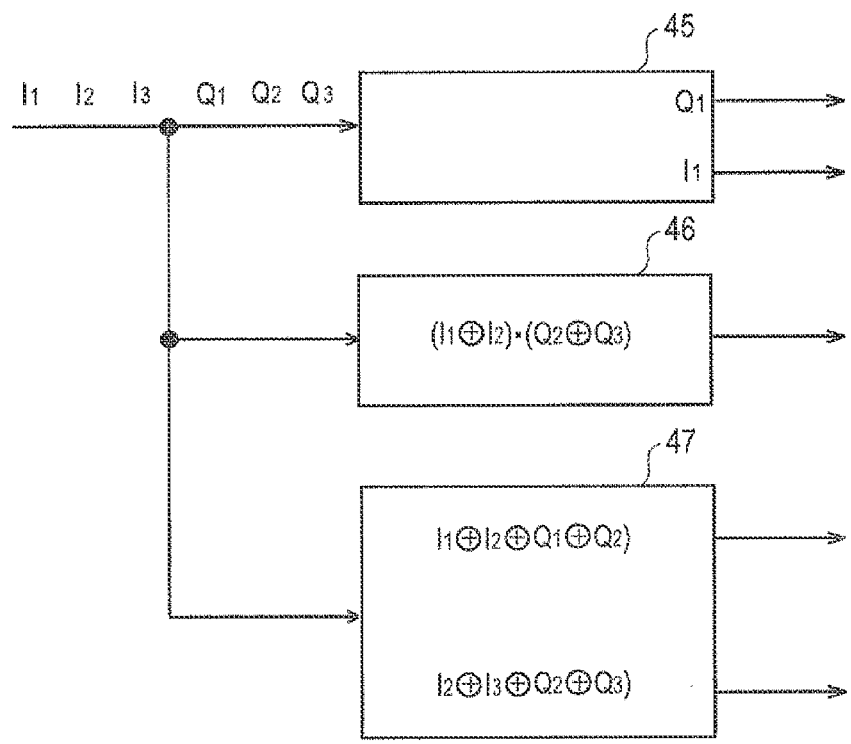

The area determination decoding devices (1, 2), (3), and (4, 5) of FIG. 19A each reversely perform the area mapping of FIG. 18A, so that operation thereof can be achieved by reversing the input and output of each table. Besides, the operation of each of the area determination decoding devices can be achieved using a combinational circuit equivalent to the table reference, and the use of the combinational circuit can reduce total hardware size in the example using the mapping illustrated in FIGS. 6 to 8. For example, the area determination decoding devices (1, 2) 41, (3) 42, and (4, 5) 43 of FIG. 19A are equivalent to a logical expression of FIG. 19B. In this expression, "+" denotes an exclusive-OR (in the drawing, + is surrounded by circle), and "·" denotes an AND operation.

Figure 1:
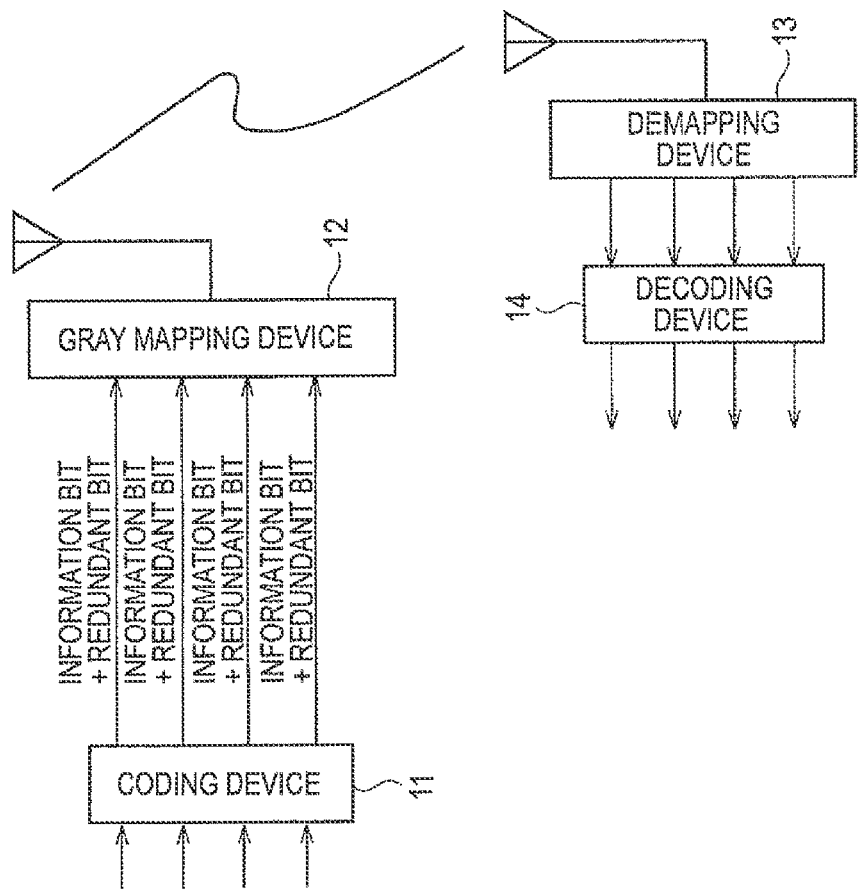
FIG. 1 A view for explaining a related art (coding for all bits) concerning a 16 QAM data communication.
Figure 37:
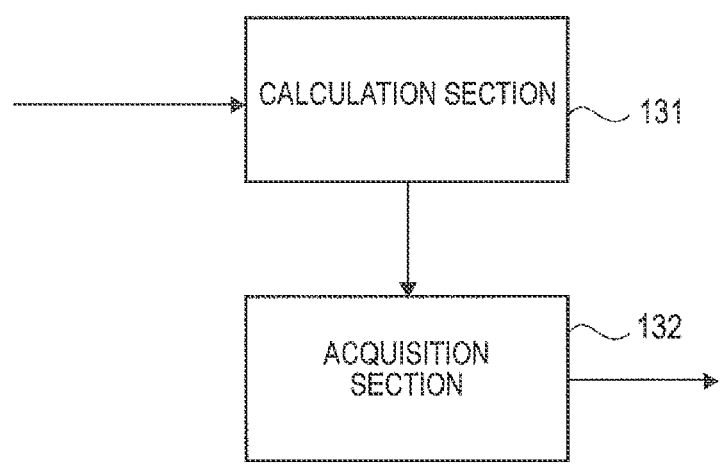
FIG. 37 A block diagram illustrating a configuration example of a device (demodulation device) that executes demapping.

The following describes a configuration example of a device (demodulation device) that executes the demapping of FIG. 19A using FIG. 37. The demodulation device is an example of a demodulation device that uses a $2^{2n+1}$ (n is a positive integer) QAM modulation scheme in which $2^{2n+1}$ signal points arranged in a cross shape are used to transmit 2n+1-bit data, and n is set to 2, in this example. That is, the device of FIG. 19A is a demodulation device that uses a 32 QAM modulation scheme in which 32 signal points arranged in a cross shape are used to transmit 5-bit data. As illustrated in FIG. 37, the demodulation device includes a calculation section 131 that calculates, from the received signal point, the 5-bit data corresponding to the transmitted signal point closest to the received signal point according to a correspondence between the 5-bit data to be transmitted and the 32 signal points determined by FIG. 18B and a data transmission method defined by the modulation device of FIG. 35 and an acquisition section 132 that acquires, in correspondence to an area including the received signal point, two 2-bit data by referring to FIG. 18B and area mapping tables identical to the two 2-bit area mapping tables 112 and 114 of the modulation device of FIG. 35 and 1 bit by referring to an area mapping table identical to the 1-bit area mapping table 113. The acquisition section 132 includes area mapping tables identical to the area mapping tables 112, 113, and 114.

FIGS. 20, 22, 21, and 23 to be described later can be configured as FIGS. 18A, 18 B, 19A, and 19B.

FIG. 20 is a block diagram illustrating an example of a mapping device of a $2^{2n}$ QAM scheme in which the circular signal constellation illustrated in FIG. 4 is used to transmit 2n-bit data (n is an integer equal to or larger than 4). Hereinafter, for simple explanation, n is set to 4, that is, the 256 QAM scheme will be described. As described above, the gray coding is applied to a lower bit portion, so that the same configuration can be applied to a case where n>4. In the case where n>4, the lower 2 (n−4) bits are subjected to the gray coding by a gray coding device 52 (see FIG. 20).

In a case where the coordinate value of each of I and Q axes is represented by 5 bits in the 256 QAM using the circular signal constellation of FIG. 4, a basic operation concerning the bit mapping device for bit mapping to the signal points is the same as that described using FIG. 18.

In an area mapping table 51, there may be a case where area mapping of the first, second, third, and fourth bits of 8 bits to be transmitted is performed using FIG. 9, and the area mapping of the fifth, sixth, seventh, and eighth bits is performed using FIG. 10 (first mapping). Further, there may be a case where the area mapping of the first, second, third, and fourth bits is performed using FIG. 11, and the area mapping of the fifth, sixth, seventh, and eighth bits is performed using FIG. 10 (second mapping). Furthermore, there may be a case where the area mapping of the first and second bits is performed using 6-C-1 of FIG. 11, the area mapping of the third and fourth bits is performed using 6-A-2 of FIG. 9, the area mapping of the fifth and sixth bits is performed using FIG. 12, and the area mapping of the seventh and eighth bits is performed using 6-B-2 of FIG. 10 (third mapping). In the case of the first mapping, the average Hamming distance between the adjacent signal points is small. In the case of the second mapping, the average Hamming distance between the adjacent signal points in terms of a lower 6-bit portion is small and the Euclidean distance between the signal points at which the lower 6-bit portions assigned thereto coincide with each other is large. In the case of the third mapping, the average Hamming distance between the adjacent signal points in terms of a lower 4-bit portion is small and the Euclidean distance between the signal points at which the lower 4-bit portions assigned thereto coincide with each other is large. In a case where the error correction code is applied, all the bits are subjected to the error correction code in the first mapping, only the lower 6-bit portion is subjected to the error correction code in the second mapping, and only the lower 4-bit portion is subjected to the error correction code in the third mapping.

Figure 21:
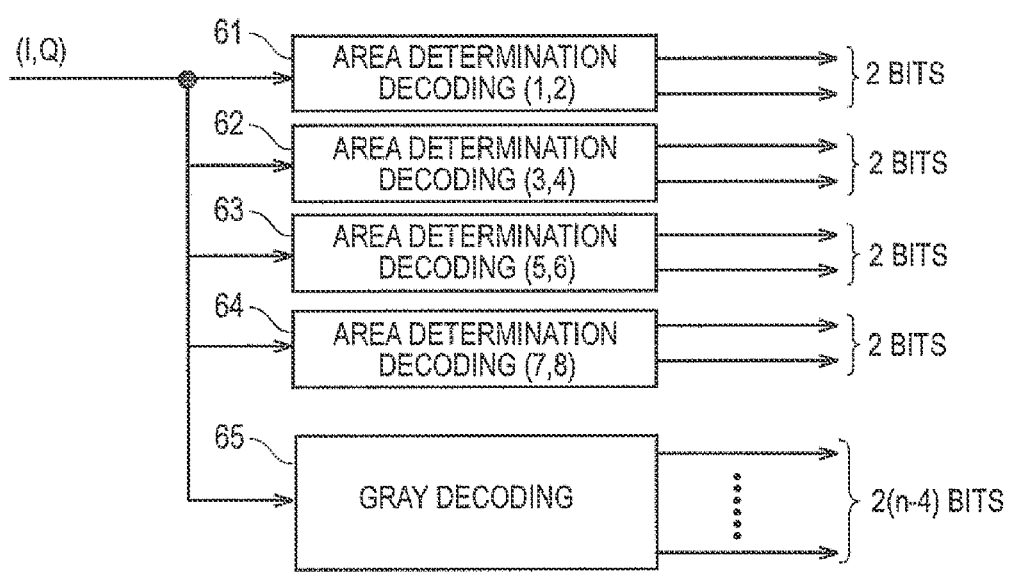
FIG. 21 A view for explaining a $2^{2n}$ QAM scheme (decoding; n≥4).

FIG. 21 is a block diagram illustrating an example of a device that executes demapping that calculates a transmitted bit from the received signal point. The device of FIG. 21 includes an area determination decoding device (1, 2) 61, an area determination decoding device (3, 4) 62, an area determination decoding device (5, 6) 63, and an area determination decoding device (7, 8) 64. Each of the area determination decoding devices inputs the I and Q axes coordinate values corresponding to the received signal point of the communication channel output and outputs a bit sequence assigned to an area including the received signal point. The basic operations thereof are the same as those described using FIG. 18, and the area mapping tables identical to those used on the transmitting side are used for each area determination decoding. A gray decoding device 65 performs gray decoding to output 2 (n−4) bits.

Figure 22:
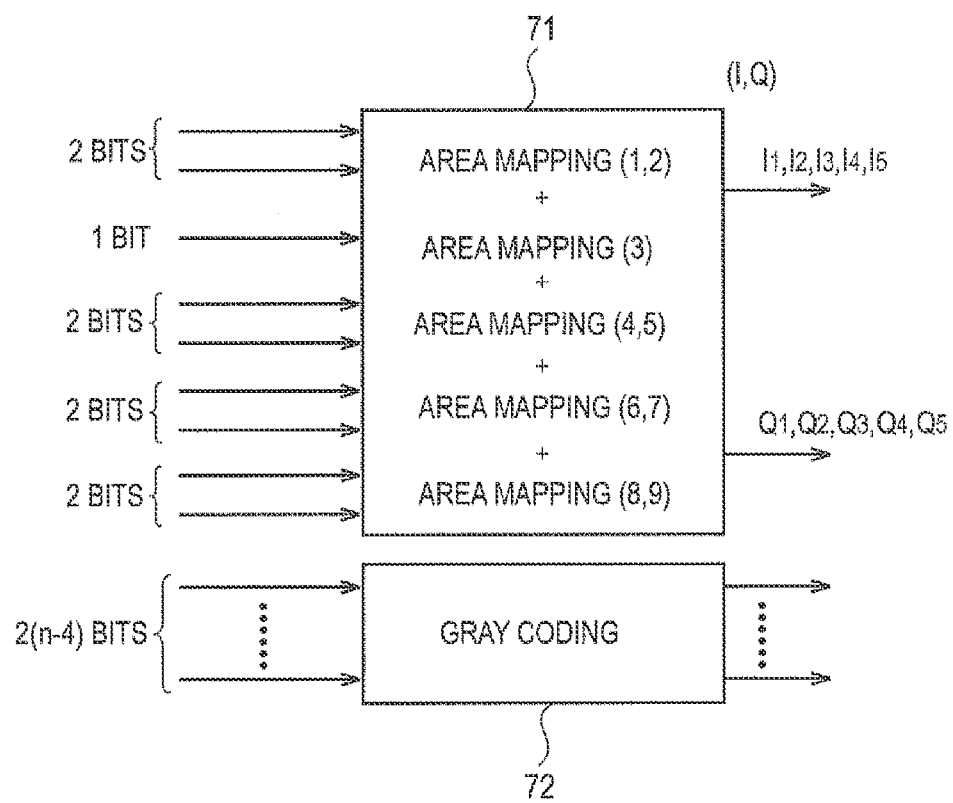
FIG. 22 A view for explaining the $2^{2n+1}$ QAM scheme (coding; n≥4).

Finally, a $2^{2n+1}$ QAM scheme in which the circular signal constellation illustrated in FIG. 5 is used to transmit 2n+1-bit data will be described. FIG. 22 is a block diagram illustrating an example of a mapping device of the $2^{2n+1}$ QAM scheme (n is an integer equal to or larger than 4). Hereinafter, for simple explanation, n is set to 4, that is, the 512 QAM scheme will be described. As described above, the gray coding is applied to a lower bit portion, so that the same configuration can be applied to a case where n>4. In the case where n>4, the lower 2 (n−4) bits are subjected to the gray coding by a gray coding device 72 (see FIG. 22).

In a case where the coordinate value of each of I and Q axes is represented by 5 bits in the 512 QAM using the circular signal constellation of FIG. 5, a basic operation concerning the bit mapping device for bit mapping to the signal points is the same as that described using FIGS. 18 and 19.

Figure 14:
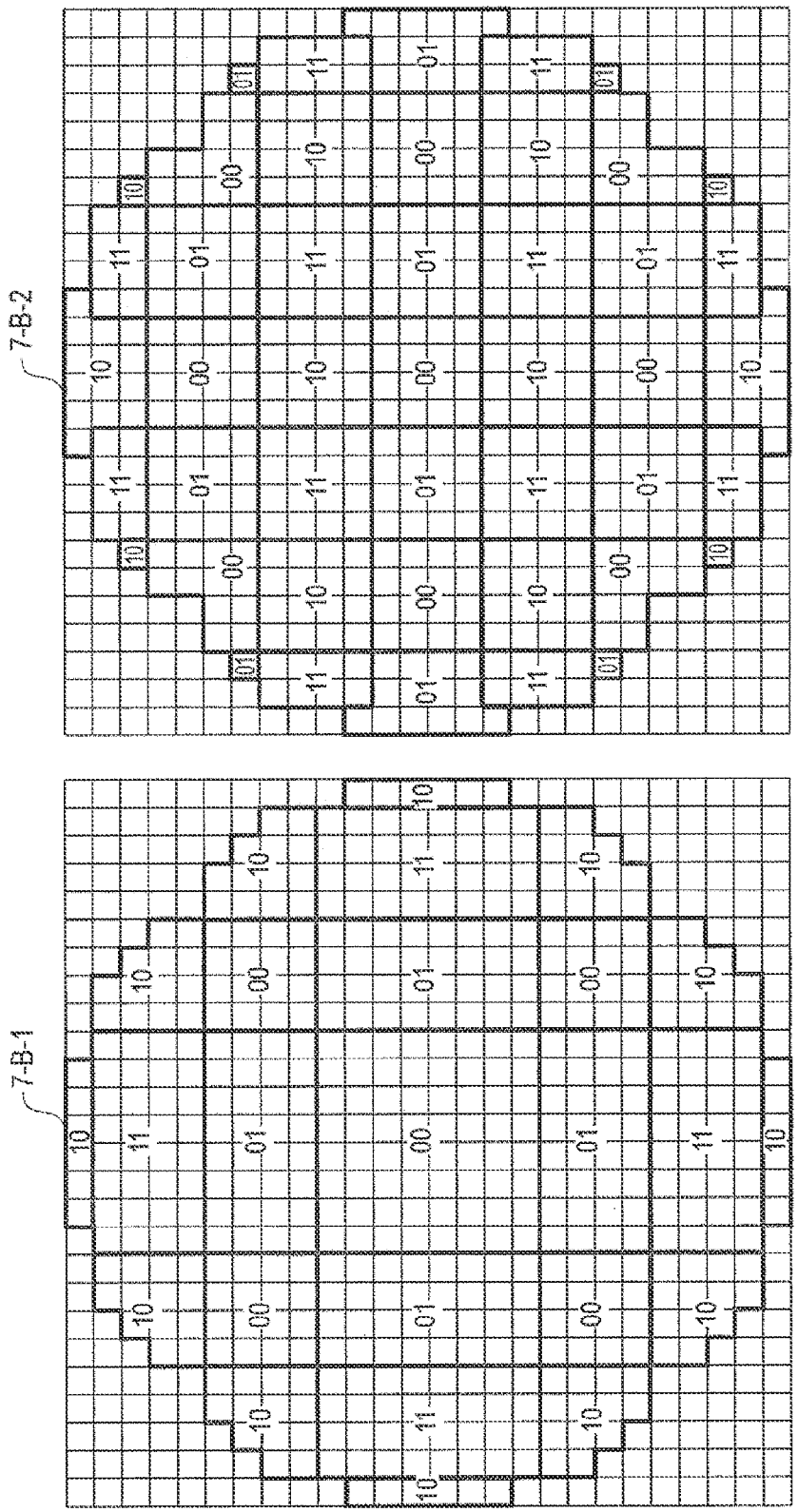
FIG. 14 A view for explaining area division and bit assignment (fourth and fifth bits, sixth and seventh bits).
Figure 15:
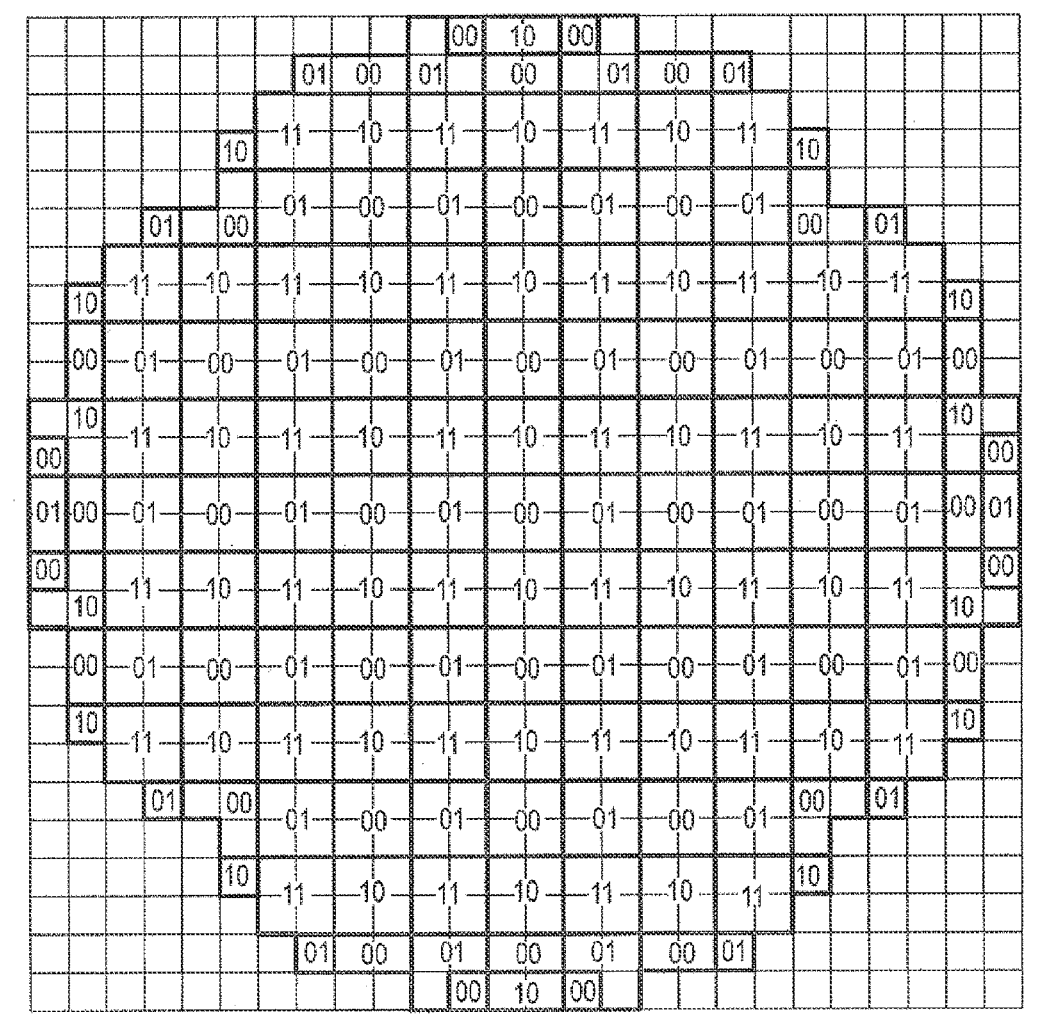

In an area mapping table 71, there may be a case where area mapping of the first, second and third bits of 9 bits to be transmitted is performed using FIG. 13, the area mapping of the fourth, fifth, sixth, and seventh bits is performed using FIG. 14, and the area mapping of the eighth and ninth bits is performed using FIG. 15 (first mapping). Further, there may be a case where the area mapping of the first and second bits is performed using 7-A-1 of FIG. 13, the area mapping of the third, fourth, and fifth bits is performed using FIG. 16, the area mapping of the sixth and seventh bits is performed using 7-B-1 of FIG. 14, and the area mapping of the eighth and ninth bits is performed using FIG. 15 (second mapping). In the case of the first mapping, the average Hamming distance between the adjacent signal points is small. In the case of the second mapping, the average Hamming distance between the adjacent signal points in terms of a lower 7-bit portion is small and the Euclidean distance between the signal points at which the lower 7-bit portions assigned thereto coincide with each other is large. In a case where the error correction code is applied, all the bits are subjected to the error correction code in the first mapping, and only the lower 7-bit portion is subjected to the error correction code in the second mapping.

Figure 23:
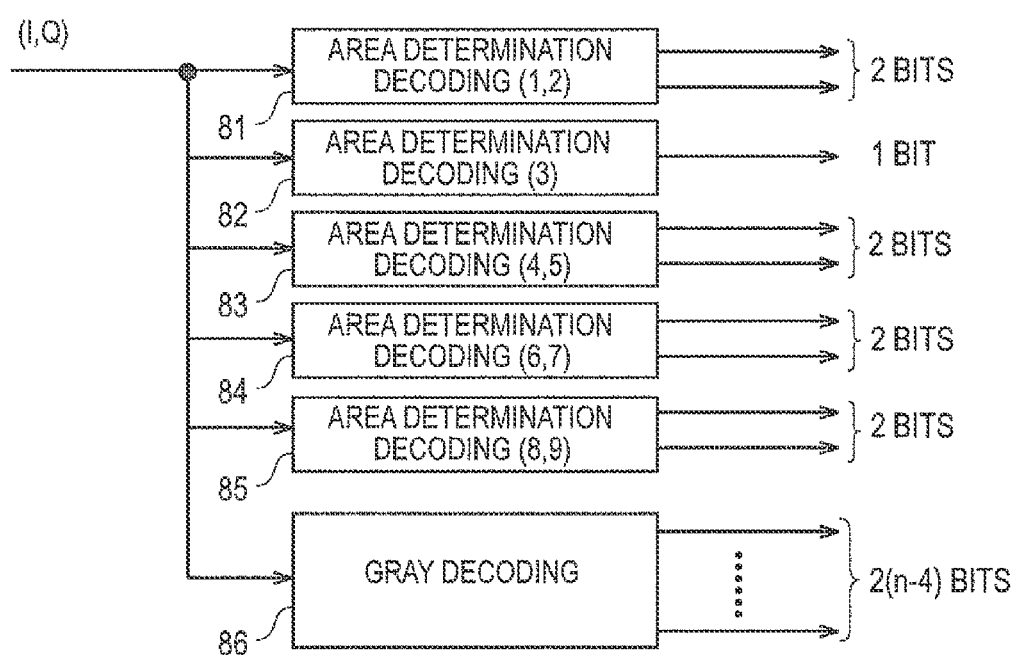
FIG. 23 A view for explaining the $2^{2n+1}$ QAM scheme (decoding n≥4).

FIG. 23 is a block diagram illustrating an example of a device that executes demapping that calculates a transmitted bit from the received signal point. The device of FIG. 23 includes an area determination decoding device (1, 2) 81, an area determination decoding device (3) 82, an area determination decoding device (4, 5) 83, an area determination decoding device (6, 7) 84, and an area determination decoding device (8, 9) 85. Each of the area determination decoding devices inputs the I and Q axes coordinate values corresponding to the received signal point of the communication channel output and outputs a bit sequence assigned to an area including the received signal point. The basic operations thereof are the same as those described using FIGS. 18 and 21, and the area mapping tables identical to that used on the transmitting side are used for each area determination decoding. A gray decoding device 86 performs gray decoding to output 2 (n−4) bits.

Figure 33:
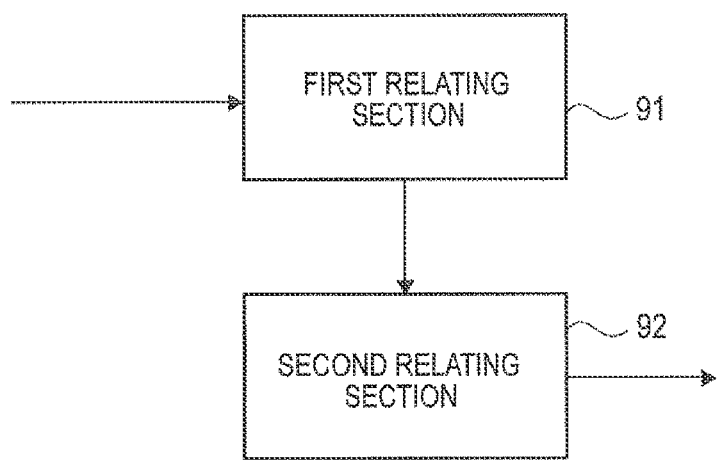
FIG. 33 A block diagram illustrating a configuration example of a modulation device of a $2^{2n}$ (n is a positive integer) QAM modulation scheme in which circularly-arranged $2^{2n}$ signal points obtained by rearranging a part of the $2^{2n}$ signal points arranged in a rectangular shape are used to transmit 2n-bit data.

FIG. 33 illustrates a configuration example of a modulation device of a $2^{2n}$ (n is a positive integer) QAM modulation scheme in which circularly-arranged $2^{2n}$ signal points obtained by rearranging a part of the $2^{2n}$ signal points arranged in a rectangular shape are used to transmit 2n-bit data. A first relating section 91 relates a 2n-bit pattern whose lower 2t bits and upper 2(n−t) bits have been independently subjected to the gray coding to the signal points coinciding with the rectangular signal constellation to perform mapping (t is a positive integer smaller than n). Then, a second relating section 92 relates the 2n-bit pattern to each of the signal points rearranged into the circular shape in such a way that the average Hamming distance between the adjacent signal points in terms of the lower 2t-bit portion is minimum and the Euclidean distance between the signal points at which the lower 2t-bit portions assigned thereto coincide with each other among all the 2n-bit patterns excluding the patterns that have been assigned to the signal points coinciding with the rectangular signal constellation. As has been described using FIG. 4, the circular signal constellation can be obtained by moving a part of the signal points in the rectangular constellation. The mapping method (n=4) that has been described using FIGS. 9 to 12 can be used for the circularly-arranged signal points. The processing of the second relating section 92 may be performed prior to the processing of the first relating section 91. The first and second relating sections 91 and 92 each include an area mapping table for use in the mapping.

Figure 34:
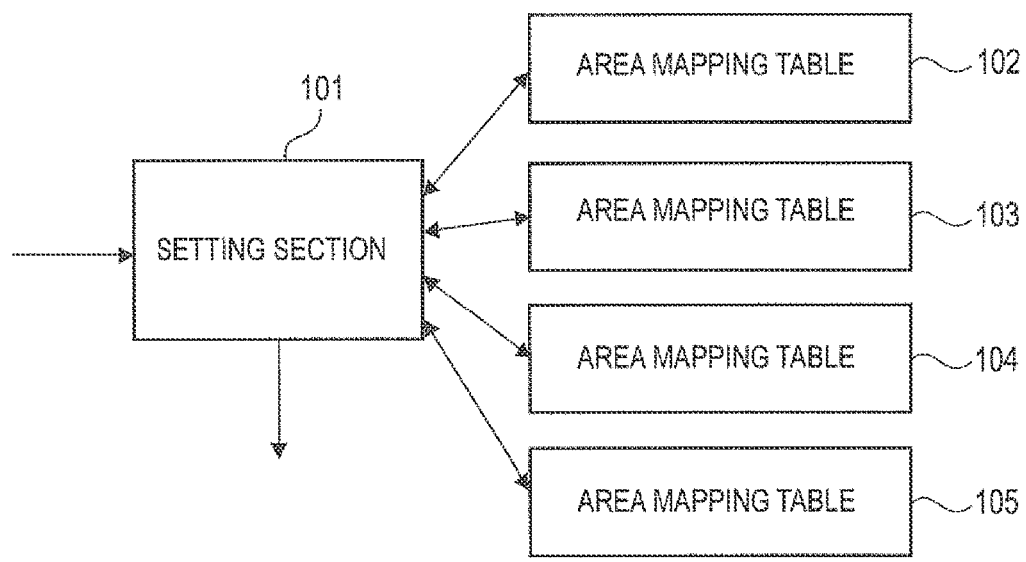
FIG. 34 A block diagram illustrating another configuration example of the modulation device of the $2^{2n}$ (n is a positive integer) QAM modulation scheme in which the circularly-arranged $2^{2n}$ signal points obtained by rearranging a part of the $2^{2n}$ signal points arranged in the rectangular shape are used to transmit 2n-bit data.

FIG. 34 illustrates another configuration example of the modulation device of the $2^{2n}$ (n is a positive integer) QAM modulation scheme in which the circularly-arranged $2^{2n}$ signal points obtained by rearranging a part of the $2^{2n}$ signal points arranged in the rectangular shape are used to transmit 2n-bit data. Here, an example of a 256 QAM (n=4) modulation device will be described. This modulation device includes four area mapping tables 102 to 105 that each divide the signal area including 256 signal points into a plurality of areas, each applying gray coding by which a Hamming distance between the adjacent areas differ from each other by 1 to the divided areas included in the rectangular constellation to assign 2 bits to each thereof, and each assigning 2 bits to each divided area not included in the rectangular constellation in such a way that an average Hamming distance between the adjacent areas becomes minimum, and a setting section 101 that divides 8-bit data into four 2-bit data and locates the signal point for the 8-bit data to a common portion among four signal areas obtained by referring to the four area mapping tables 102 to 105 among which the divided areas to which the 2-bit data has been assigned differ in shape. The area mapping tables 102 to 105 correspond to the area mapping table (1, 2), area mapping table (3, 4), area mapping table (5, 6), and area mapping table (7, 8) of FIG. 20, respectively. As has been described using FIG. 4, the circular signal constellation can be obtained by moving a part of the signal points in the rectangular constellation. The mapping method (n=4) that has been described using FIGS. 9 to 12 can be used for the circularly-arranged signal points.

Figure 36:
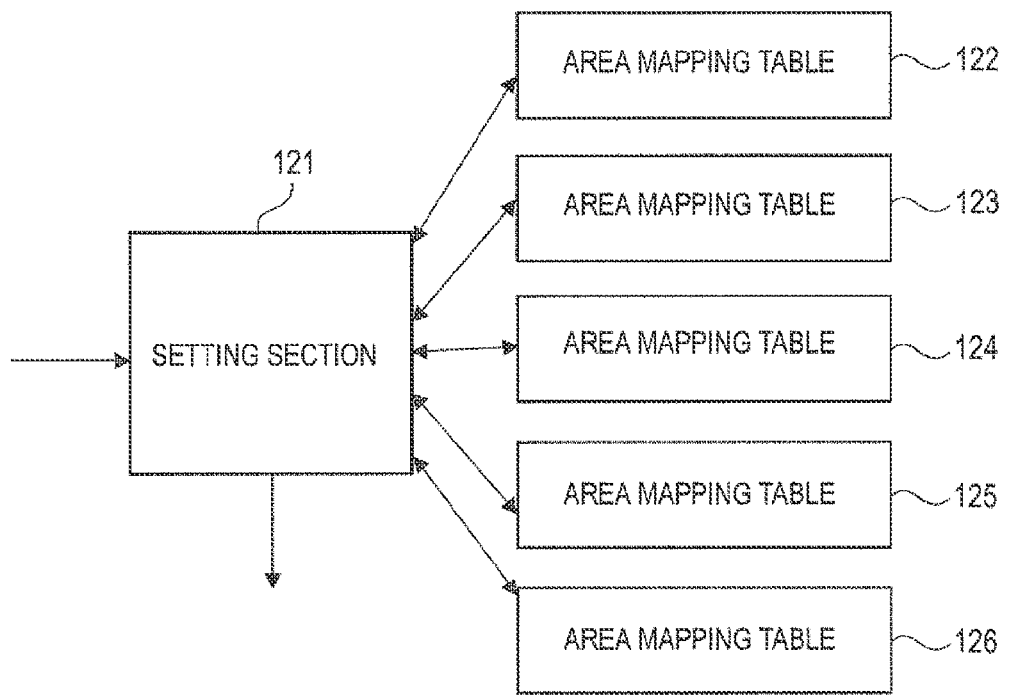
FIG. 36 A block diagram illustrating a configuration example of a modulation device of a $2^{2n+1}$ QAM modulation scheme in which circularly-arranged $2^{2n+1}$ signal points obtained by rearranging a part of the $2^{2n+1}$ signal points arranged in a cross shape are used to transmit 2n+1-bit data.

FIG. 36 illustrates a configuration example of a modulation device of a $2^{2n+1}$ QAM modulation scheme in which circularly-arranged $2^{2n+1}$ signal points obtained by rearranging a part of the $2^{2n+1}$ signal points arranged in a cross shape are used to transmit 2n+1-bit data. Here, an example of a 512 QAM (n=4) modulation device will be described. This modulation device corresponds to the modulation device of FIG. 22, includes first area mapping tables 122, 124, 125, and 126 that each divide the signal area including 512 signal points into a plurality of areas and each assign 2 bits to each divided area in such a way that the bit values differ from each other between adjacent areas, a second area mapping table 123 that divides the signal area including 512 signal points into a plurality of areas and assigns 1 bit to each divided area in such a way that the bit value differs from each other between adjacent areas, and a setting section that divides 9-bit data into four 2-bit data and one 1-bit data and locates the signal points for the 9-bit data to a common portion between a common portion among four signal areas obtained by referring, as to each of the four 2-bit data, to the four first area mapping tables 122, 124, 125, and 126 among which the divided areas differ in shape and an area determined by the second area mapping table 123 in correspondence to the 1-bit data. The area mapping tables 122 to 126 correspond to the area mapping table (1, 2), area mapping table (3), area mapping table (4, 5), area mapping table (6, 7) and area mapping table (8, 9) of FIG. 22, respectively. As has been described using FIG. 5, the circular signal constellation can be obtained by moving a part of the signal points in the cross constellation. The mapping method (n=4) that has been described using FIGS. 13 to 16 can be used for the circularly-arranged signal points.

A demodulation device that uses a $2^{2n}$ QAM modulation scheme in which circularly-arranged $2^{2n}$ signal points are used to transmit 2n-bit data can be configured as FIG. 37 (n is an positive integer). Here, an example of a demodulation device of a 256 QAM (n=4) modulation scheme will be described. As illustrated in FIG. 37, the demodulation device includes the calculation section that calculates, from the received signal point, the 8-bit data corresponding to the transmitted signal point closest to the received signal point according to a correspondence between the 8-bit data to be transmitted and the 256 signal points determined by the mapping method of the modulation device described using FIG. 34, and the acquisition section 132 that acquires, in correspondence to an area including the received signal point, four 2-bit data by referring to area mapping tables identical to the four area mapping tables 102 to 105 of the modulation device described using FIG. 34. The four area mapping tables are included in the acquisition section 132.

A demodulation device that uses a $2^{2n+1}$ QAM modulation scheme in which circularly-arranged $2^{2n+1}$ signal points obtained by rearranging a part of the $2^{2n+1}$ signal points arranged in a cross shape are used to transmit 2n+1-bit data can be configured as FIG. 37 (n is an positive integer). Thus, a configuration of a demodulation device will be described using FIG. 37. Here, an example of a modulation device of a 512 QAM (n=4) modulation scheme will be described. The demodulation device includes the calculation section 131 that calculates, from the received signal point, the 9-bit data corresponding to the transmitted signal point closest to the received signal point according to a correspondence between the 9-bit data to be transmitted and the 512 signal points determined by the data transmission method of the modulation device described using FIG. 36, and the acquisition section 132 that acquires, in correspondence to an area including the received signal point, four 2-bit data by referring to area mapping tables identical to the four 2-bit area mapping tables 122, 124, 125, and 126 of the modulation device of FIG. 36 and 1 bit by referring to an area mapping table identical to the 1-bit area mapping table 123. The five area mapping tables are included in the acquisition section 132.

Second Embodiment

In FIG. 4, the example in which the signal constellation space is divided into 256 areas and the 1024 circular signal points arranged in a circular shape in which four signal points are included in each divided area. By modifying the location of some of the 1024 signal points, a signal constellation having a lower average signal power can be obtained. Even in such a signal constellation, the same mapping as described in the first embodiment can be performed.

Figure 24:
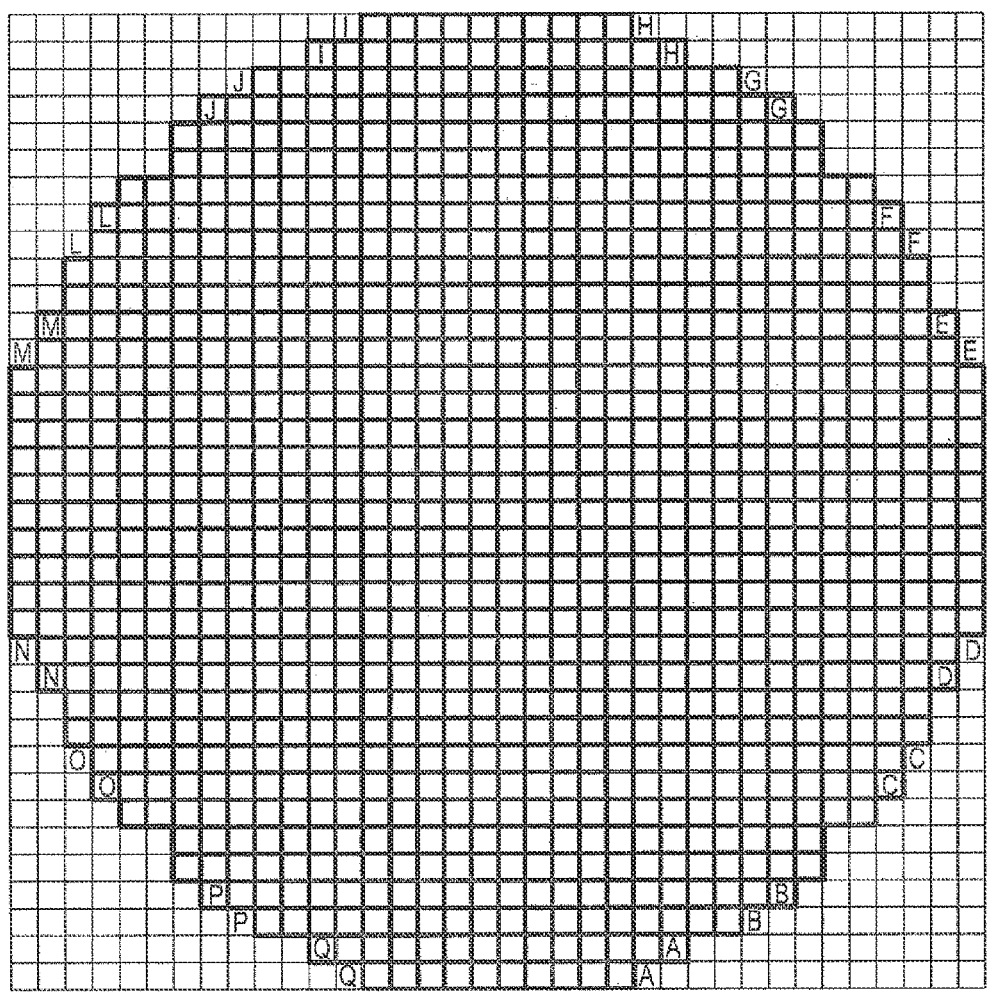
FIG. 24 A view for explaining division (1024 division) of a signal constellation space.

FIG. 24 illustrates an example in which the signal area is divided into 1024 areas. In the circularly-arranged signal constellation, the signal points marked "A" within the constellation area are moved to portions marked "A" outside the constellation area and, similarly, the signal points marked "B" to "Q" within the constellation area are moved to portions marked "B" to "Q" outside the constellation area, whereby the signal constellation coinciding with the 1024 QAM signal constellation illustrated in FIG. 4 in which four signal points are included in each one square can be obtained. It can be said that the signal constellation of FIG. 24 is obtained by moving 16 of 1024 signal points obtained by division so as to reduce the average signal power. Thus, the same mapping as described above can be applied to the signal constellation obtained by rearranging a part of the signal points so as to minimize the average power. The concrete examples will be described below.

Figure 25:
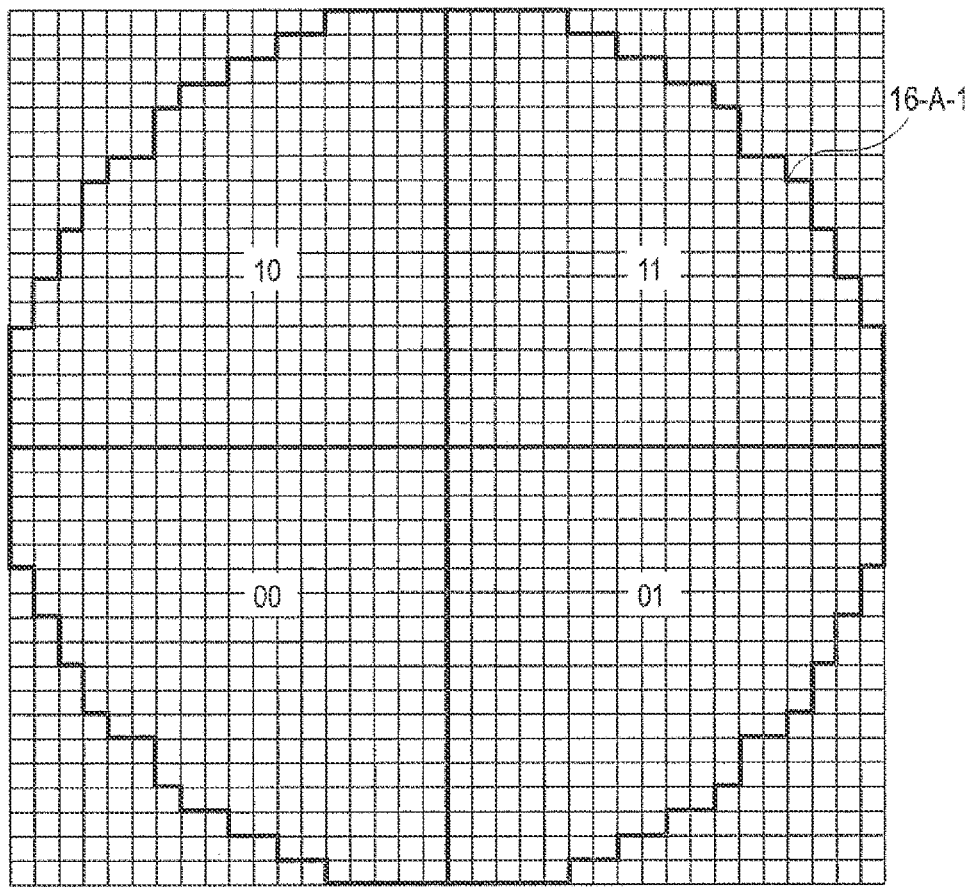
FIG. 25 A view for explaining area division and bit assignment (first and second bits).
Figure 26:
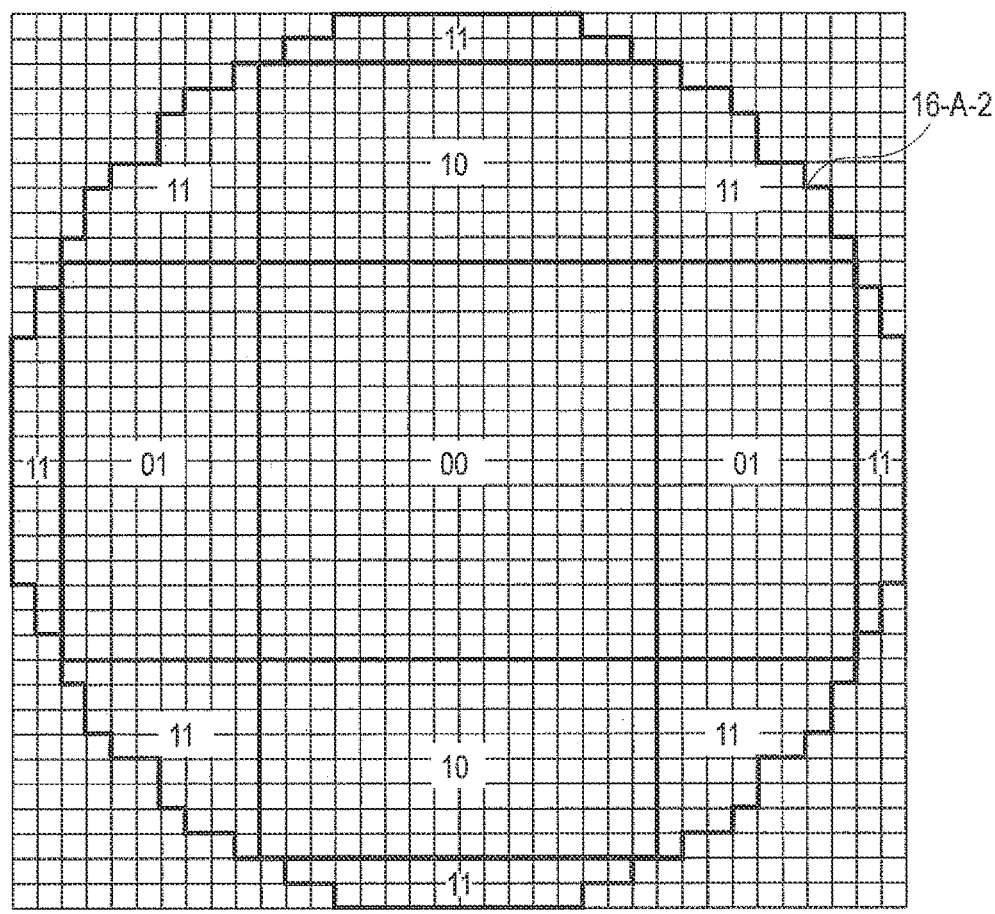
FIG. 26 A view for explaining area division and bit assignment (third and fourth bits).

As in the method described in the first embodiment, in a case where data transmission is performed in the 1024 QAM of FIG. 24, 10-bit data (1024=210) is divided into 2-bit+2-bit+2-bit+2-bit+2-bit, and the obtained 2-bit, 2-bit, 2-bit, 2-bit, and 2-bit are related to the subdivided signal areas, respectively. First, the signal area for the upper 2 bits (first and second bits) is determined using FIGS. 25 to 32. In 16-A-1 of FIG. 25, the signal area is divided into four quadrants (first quadrant: 11, second quadrant: 10, third quadrant: 00, fourth quadrant: 01). Tables 14 and 54 are identical to Table 16-A-1 of FIG. 25. Then, 16-A-2 of FIG. 26 is used to select the signal area for third and fourth bits. Tables 15, 25, 55 and 65 are identical to Table 16-A-2 of FIG. 26. Similarly, the signal areas for the fifth and sixth bits, and seventh and eighth bits are selected based on the area division views illustrated in FIGS. 27 and 28, respectively and the signal areas for the ninth and tenth bits are selected based on the area division views illustrated in FIG. 29. Tables 16, 21, 56 and 61 are identical to Table 16-B-1 of FIG. 27. Tables 17, 22, 27, 57, 62, and 67 are identical to Table 16-B-2 of FIG. 28. Tables 18, 23, 28, 58, 63, and 68 are identical to the table of FIG. 29. Then, one of the 1024 areas of FIG. 24 is selected as a common portion among the selected five areas. In a case where the 10-bit data is assigned to 1024 signal points using FIGS. 25, 26, 27, 28, and 29 as described above, the average Hamming distance between the adjacent signal points becomes small, so that a mapping method superior in bit error rate characteristics can be achieved. Unlike the case of the rectangular constellation, the gray mapping cannot be applied to the circular signal constellation in general, so that the average Hamming distance becomes larger than 1.

Next, focusing on the lower 8 bits, there will be described a mapping method in which the average Hamming distance between the adjacent signal points in terms of the lower 8-bit portion is small and the Euclidean distance between the signal points at which the lower 8-bit portions assigned thereto coincide with each other is large. In the mapping method according to FIGS. 25, 26, 27, 28, and 29, the Euclidean distance among four signal points at which the lower 8 bits are e.g., 00000000 assigned thereto coincides with the Euclidean distance $\Delta$ between the adjacent signal points and thus becomes minimum, so that requirements are not met. In this case, the signal area for the upper 2 bits (first and second bits) is determined using 16-D-1 of FIG. 30. Tables 19, 24, 59, and 64 are identical to Table 16-D-1 of FIG. 30. Then, the signal area for the third and fourth bits is determined using 16-D-2 of FIG. 31. The signal areas for the fifth, sixth, seventh, eighth, ninth, and tenth bits are determined using FIGS. 27, 28, and 29 as in the above case. Also in a case where the signal areas for the first and second bits and third and fourth bits are selected using FIGS. 30 and 31 in place of FIGS. 25 and 26, one of the 1024 areas illustrated in FIG. 24 is selected. Tables 20 and 60 are identical to Table 16-D-2 of FIG. 31. In terms of the lower 8 bits, when the 10-bit data is assigned to 1024 signal points using FIGS. 30 and 31, and FIGS. 27, 28, and 29, the average Hamming distance between the adjacent signal points becomes slightly larger than the above-described case; however, the Euclidean distance between the signal points at which the lower 8-bit portions assigned thereto coincide with each other becomes ($\sqrt{178}$) $\Delta$ or larger, thus achieving significant improvement. The application of the error correction code only to the lower 8 bits allows a communication device capable of suppressing an increase in transmission bandwidth and excellent in error rate characteristics to be provided.

Next, focusing on the lower 6 bits, there will be described a mapping method in which the average Hamming distance between the adjacent signal points in terms of the lower 6-bit portion is small and the Euclidean distance between the signal points at which the lower 6-bit portions assigned thereto coincide with each other is large. In this case, the signal area for the 10 bits is determined as follows. That is, the signal area for the first and second bits is selected using 16-D-1 of FIG. 30, the signal area for the third and fourth bits is selected using 16-A-2 of FIG. 26, the signal area for the fifth and sixth bits is selected using FIG. 32, and the signal area for the seventh, eighth, ninth, and tenth bits is selected using 16-B-2 of FIG.

Figure 29:
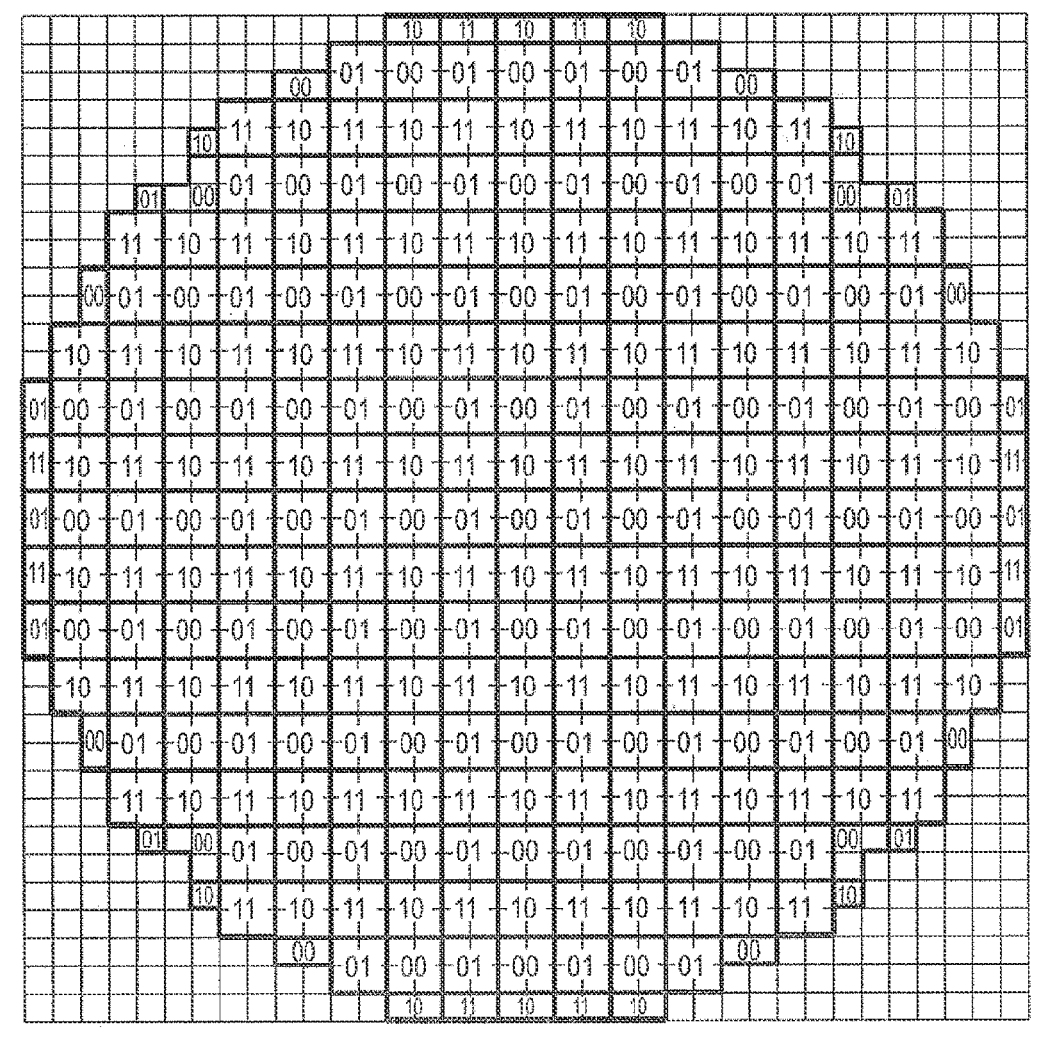

28 and FIG. 29. Finally, one of the 1024 areas of FIG. 24 is selected as a common portion among all the selected areas. The Euclidean distance between the signal points at which the lower 6-bit portions assigned thereto coincide with each other becomes $(\sqrt{26})\Delta$ or larger. Tables 26 and 66 are identical to the table of FIG. 32.

Figure 16:
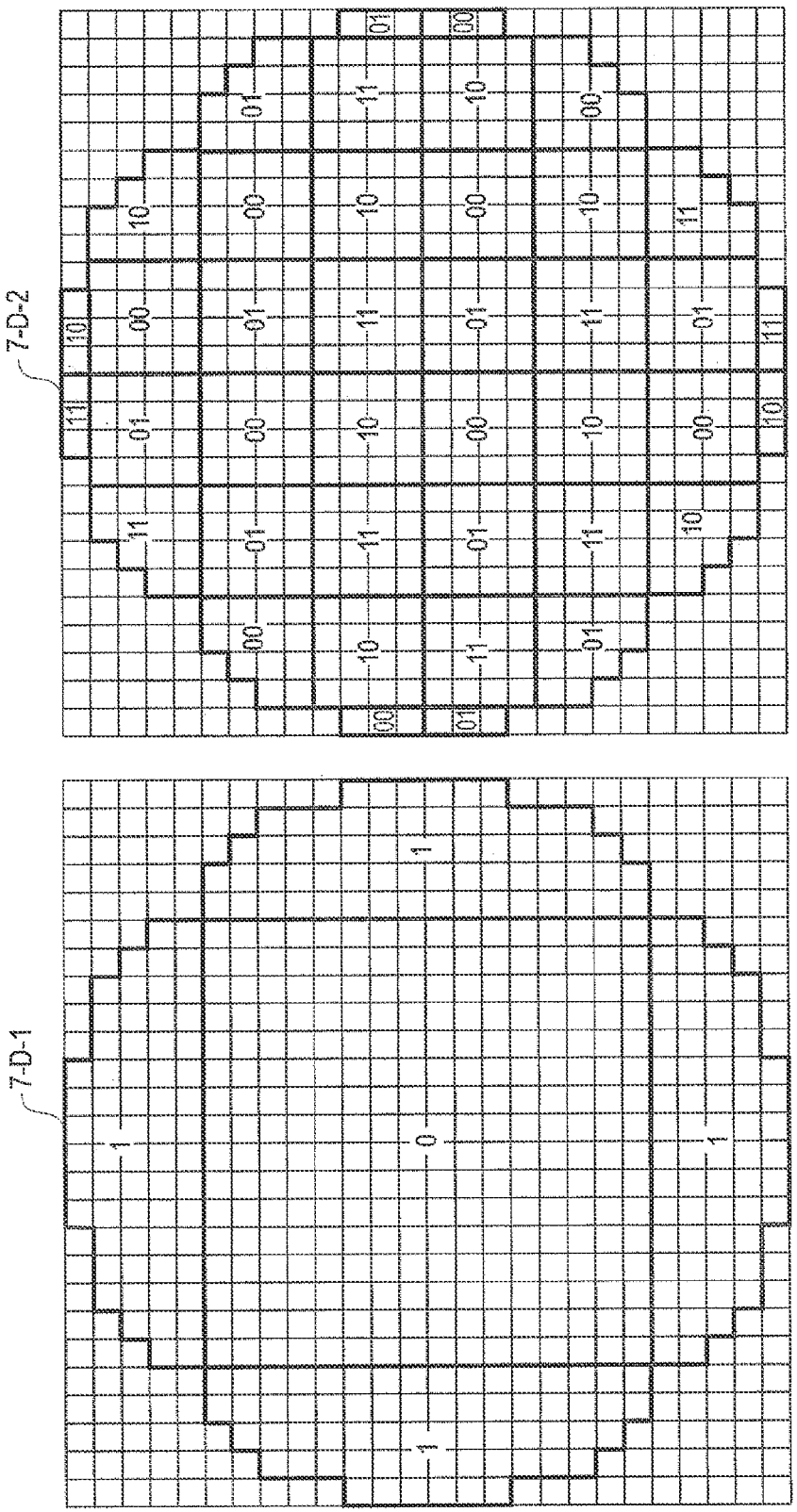
FIG. 16 A view for explaining area division and bit assignment (third bit, fourth and fifth bits).

It is clear that data transmission and data reception having the same effects can be performed also by using, as the area mapping tables, tables obtained by converting the four 2-bit patterns 00, 01, 10, 11 in the individual area mapping tables (FIG. 6, 5-B-2 of FIG. 7, 5-C-2 of FIG. 8, FIG. 9, FIG. 10, FIG. 11, FIG. 12, 7-A-1 of FIG. 13, FIG. 14, FIG. 15, 7-D-2 of FIG. 16, FIG. 25, FIG. 26, FIG. 27, FIG. 28, FIG. 29, FIG. 30, FIG. 31) used in the above-described data transmission method and data reception method of the present exemplary embodiment using a conversion algorithm in which the Hamming distance between the adjacent areas is unchanged and by using as the area mapping tables, tables obtained by replacing the two 1-bit patterns 0, 1 in the individual area mapping tables (5-B-1 of FIG. 7, 5-C-1 of FIG. 8, 7-A-2 of FIG. 13, 7-D-1 of FIG. 16).

EXAMPLES

Effects of the present invention will be described using concrete numerical values. In a 256 QAM data transmission method in which 8-bit data is assigned to 256 signal points to perform data transmission, the circularly-arranged 256 signal points illustrated in FIG. 4 are used to perform mapping of the first and second bits, the third and fourth bits, the fifth and sixth bits, and seventh and eighth bits with the mapping methods illustrated in 6-C-1 of FIG. 11, 6-A-2 of FIG. 9, FIGS. 12, and 6-B-2 of FIG. 10, respectively. In a case where the lower 4-bit (fifth, sixth, seventh, and eighth bits) portion is subjected to error correction coding, the rectangular signal constellation and double gray mapping are used, and whereby a coding gain equivalent to a conventional method in which the same error correction coding is applied can be obtained and the peak energy and average electric power can be reduced by about 30% and about 4.3%, respectively.

Figure 27:
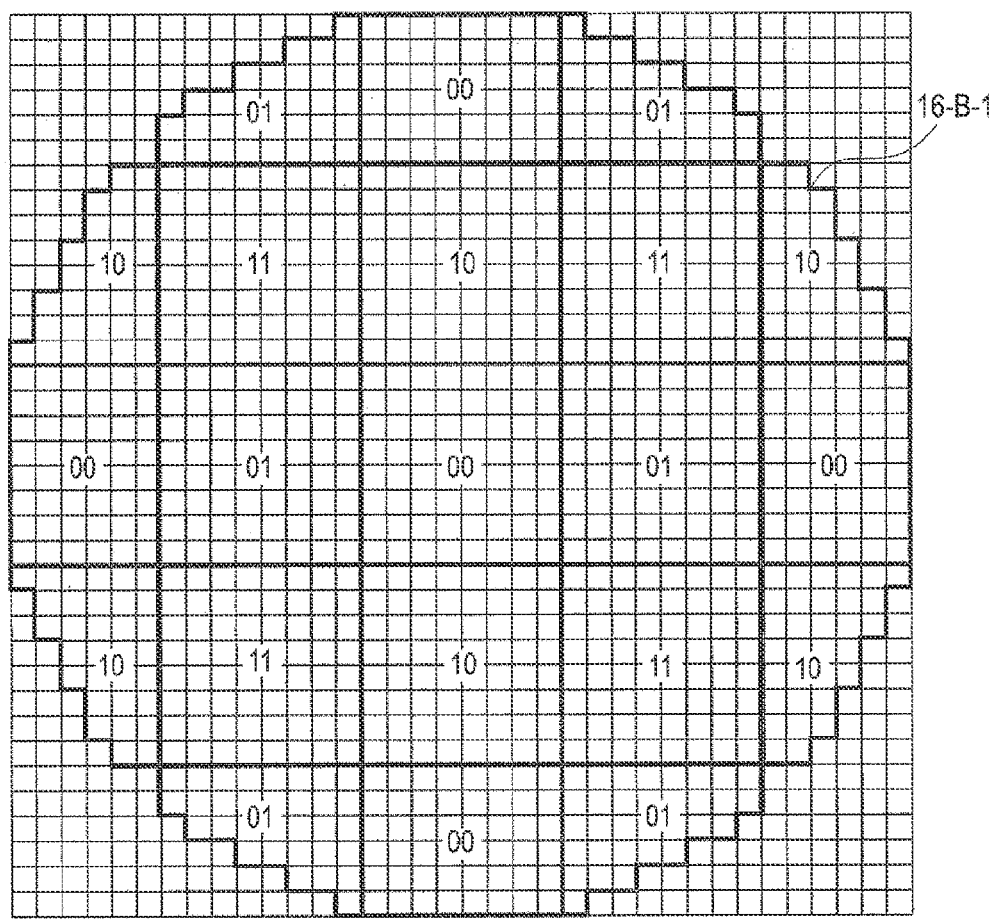
FIG. 27 A view for explaining area division and bit assignment (fifth and sixth bits).
Figure 28:
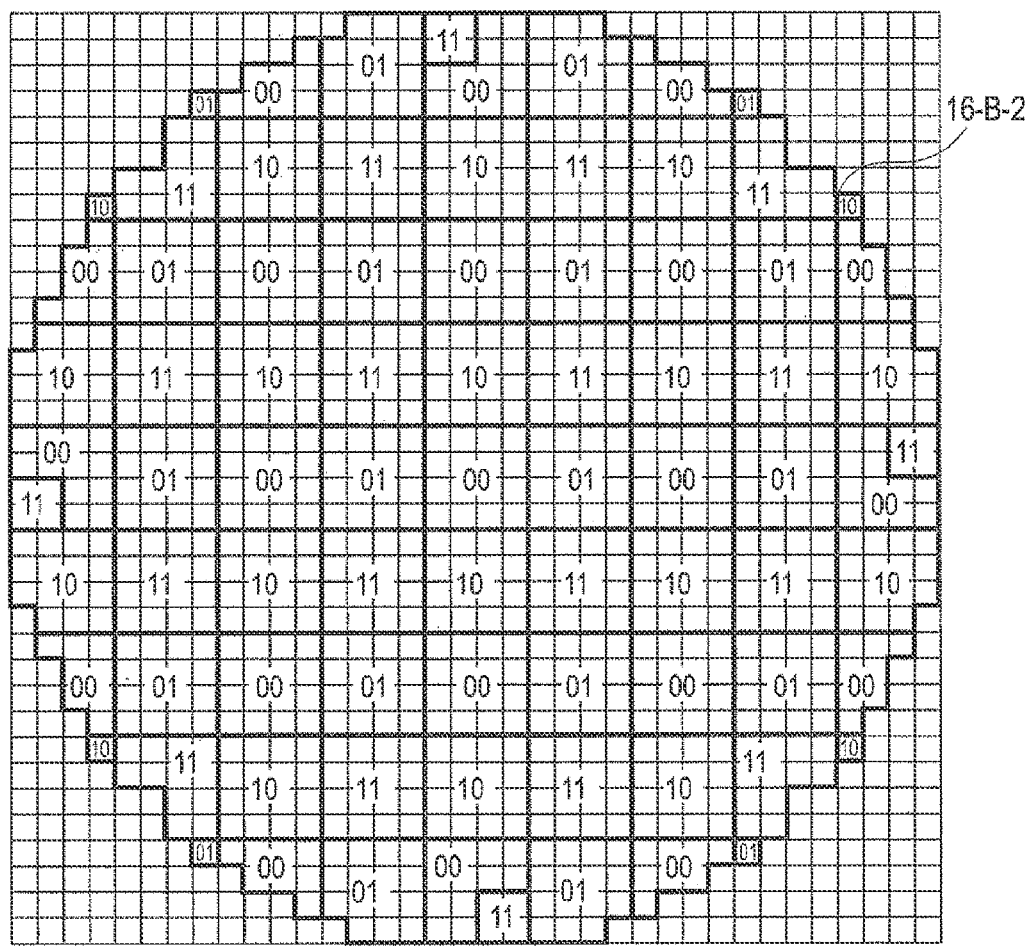
FIG. 28 A view for explaining area division and bit assignment (seventh and eighth bits).
Figure 30:
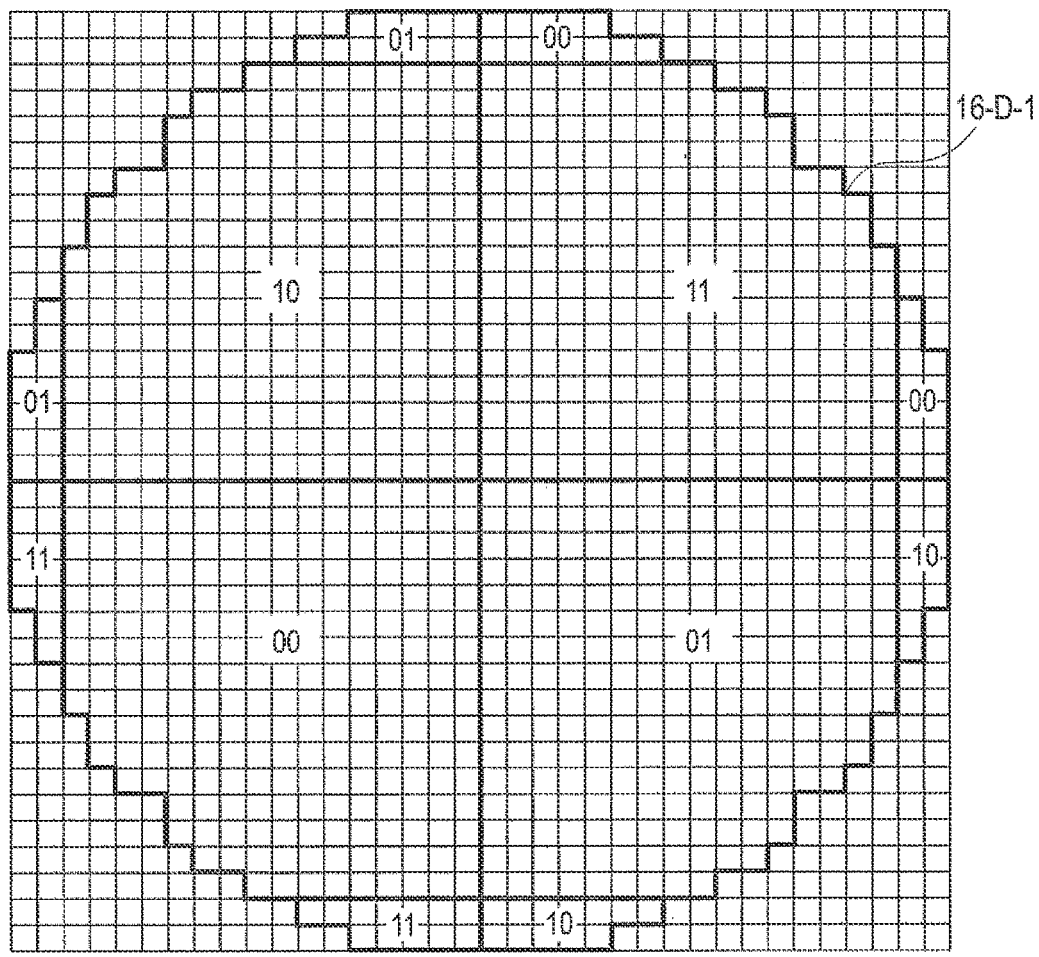
FIG. 30 A view for explaining area division and bit assignment (first and second bits).
Figure 31:
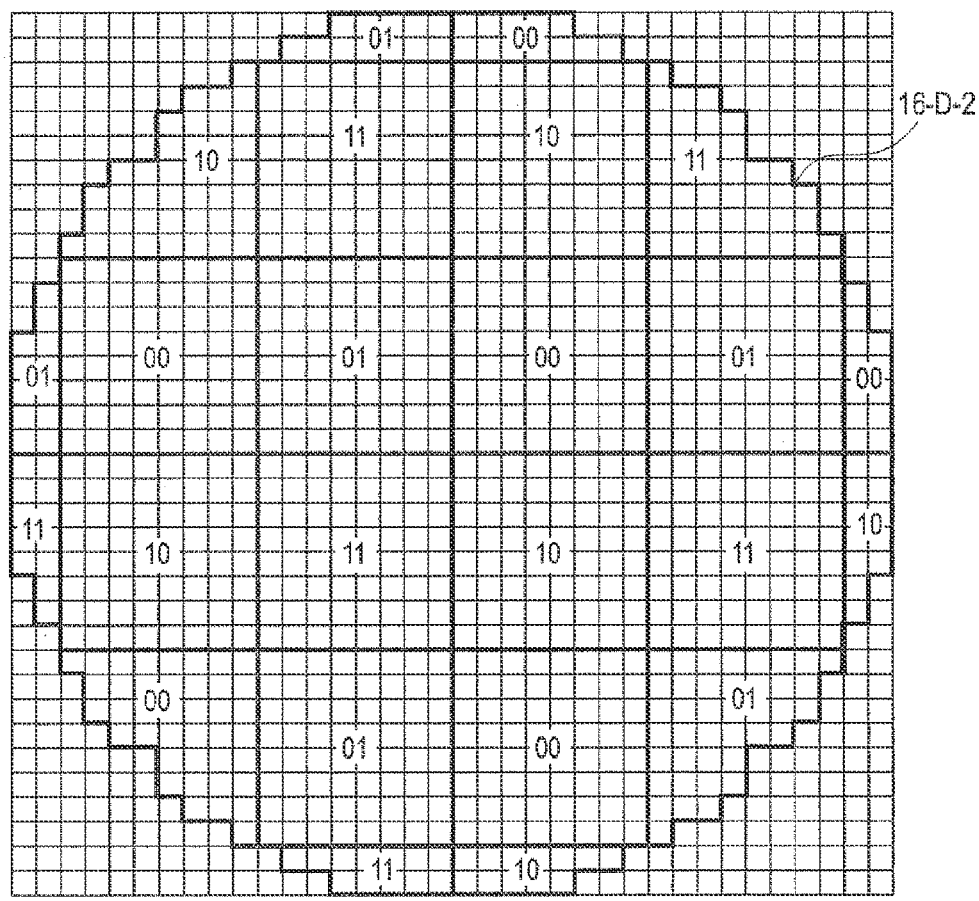
FIG. 31 A view for explaining area division and bit assignment (third and fourth bits).

Further, in a 1024 QAM scheme, the circularly-arranged 256 signal points illustrated in FIG. 24 are used to perform mapping of the first and second bits, the third and fourth bits, the fifth and sixth bits, seventh and eighth bits, and ninth and tenth bits with the mapping methods illustrated in 16-D-1 of FIG. 30, 16-D-2 of FIG. 31, 16-B-1 of FIG. 27, 16-B-2 of FIG. 28, and FIG. 29, respectively. In a case where the lower 8-bit (third, fourth, fifth, sixth, seventh, eighth, ninth and tenth bits) portion is subjected to error correction coding, the rectangular signal constellation and double gray mapping are used, and whereby a coding gain equivalent to a conventional method in which the same error correction coding is applied can be obtained and the peak energy and average electric power can be reduced by about 32% and about 4.4%, respectively.

According to the exemplary embodiments of the present invention, there can be provided a multivalued data communication method excellent in bit error rate characteristics and nonlinear distortion characteristics.

The reason for the above is that according to the exemplary embodiment of the present invention, in the $2^m$ QAM data communication in which the signal points arranged in a cross shape or circular shape are used to transmit m-bit data, a mapping device can be obtained in which the Euclidean distance between the signal points at which the previously-specified lower s bits of the m bits assigned thereto coincide with each other is large and the average Hamming distance between the adjacent signal points in terms of the lower s-bit portion is small, and that the error correction code such as the RS code or LDPC code can be applied to the lower s bits.

Further, this is because the peak energy can be reduced as compared to a case where the rectangular signal constellation is used to allow improvement of nonlinear distortion characteristics.

Although the exemplary embodiments of the present invention have been described, it should be understood that the present invention can be practiced in various forms without departing from the sprit and scope of the invention as defined by the appended claims. Thus, the above exemplary embodiments are merely illustrative and should not be considered restrictive in any way. The scope of the present invention is defined by the appended claims and not restricted by the descriptions of the specification and abstract. Further, all variations and modifications which come within the equivalent range of the claims are embraced in the scope of the present invention.

This application is based upon and claims the benefit of priority from prior Japanese Patent Application No. 2009-273461, filed Dec. 1, 2009, the entire contents of which are incorporated herein by reference.

INDUSTRIAL APPLICABILITY

The present invention may be applied as a modulation method and a demodulation method for satisfying system configuration requirements such as bit error rate characteristics and nonlinear distortion characteristics in a communication system such as a digital microwave communication system.

REFERENCE SIGNS LIST 2-1, 2-2: Signal constellation
5-B-1, 5-B-2: Area division
5-C-1, 5-C-2: Area division
6-A-1, 6-A-2: Area division
6-B-1, 6-B-2: Area division
6-C-1, 6-C-2: Area division
7-A-1, 7-A-2: Area division
7-B-1, 7-B-2: Area division
7-D-1, 7-D-2: Area division
16-A-1, 16-A-2: Area division
16-B-1, 16-B-2: Area division
16-D-1, 16-D-2: Area division

The invention claimed is:
1. A data transmission method of a $2^{2n}$ (n is a positive integer equal to or larger than four) QAM modulation scheme in which $2^{2n}$ signal points arranged in a circular shape are used to transmit 2n-bit data, the $2^{2n}$ signal points being obtained by rearranging a part of $2^{2n}$ signal points arranged in a rectangular shape, the method comprising:
a first step of relating a first 2n-bit pattern whose lower 2t (t is a positive integer smaller than n) bits and upper 2(n−t) bits have been independently subjected to gray code, to each of first signal points coinciding with the rectangular arrangement; and
a second step of relating a second 2n-bit pattern to each of second signal points rearranged into the circular shape in such a way that an average Hamming distance between adjacent signal points in terms of a lower 2t-bit portion is minimum and a Euclidean distance between signal points at which the lower 2t-bit portions assigned thereto coincide with each other is maximum, the second 2n-bit pattern being among all 2n-bit patterns excluding the first 2n-bit patterns related to the first signal points, the first and second signal points which are determined by the first and second steps being transmitted corresponding to the 2n-bit data to be transmitted.

2. A data transmission method of a $2^{2n}$ (n is a positive integer equal to or larger than four) QAM modulation scheme in which $2^{2n}$ signal points arranged in a circular shape are used to transmit 2n-bit data, the $2^{2n}$ signal points being obtained by rearranging a part of $2^{2n}$ signal points arranged in a rectangular shape, the method comprising:

providing n types of area mapping tables for each dividing a signal area including $2^{2n}$ signal points into a plurality of areas, each assigning 2 bits to each of first divided areas included in the rectangular arrangement by applying gray code that a Hamming distance between first adjacent areas differs by 1, the first divided areas being included in the plurality of areas and the first adjacent areas being included in the first divided areas, and each assigning 2 bits to each of second divided areas not included in the rectangular arrangement in such a way that an average Hamming distance between second adjacent areas becomes minimum, the second divided areas being included in the plurality of areas and the second adjacent areas being included in the second divided areas; and dividing the 2n-bit data into n 2-bit data and locating the signal point for the 2n-bit data to a common portion among n signal areas obtained by referring, as to each of the n 2-bit data, to the n area mapping tables among which the divided areas differ in shape.

3. The data transmission method according to claim 2, wherein the $2^{2n}$ signal points and 8 bits of the 2n-bit data are determined using table 6-A-1 of FIG. 9, table 6-A-2 of FIG. 9, table 6-B-1 of FIG. 10, and table 6-B-2 of FIG. 10 which are the area mapping tables.

4. The data transmission method according to claim 2, wherein the $2^{2n}$ signal points and 8 bits of the 2n-bit data are determined using table 6-C-1 of FIG. 11, table 6-C-2 of FIG. 11, table 6-B-1 of FIG. 10, and table 6-B-2 of FIG. 10 which are the area mapping tables.

5. The data transmission method according to claim 2, wherein the $2^{2n}$ signal points and 8 bits of the 2n-bit data are determined using table 6-C-1 of FIG. 11, table 6-A-2 of FIG. 9, a table of FIG. 12, and table 6-B-2 of FIG. 10 which are the area mapping tables.

6. The data transmission method according to claim 3, wherein tables obtained by converting the four 2-bit patterns 00, 01, 10, 11 in the four individual area mapping tables using a conversion algorithm in which the Hamming distance between the adjacent areas is unchanged are used as area mapping tables.

7. The data transmission method according to claim 2, wherein the n is a positive integer equal to or larger than 5, and the $2^{2n}$ signal points and 10 bits of the 2n-bit data are determined using table 16-A-1 of FIG. 25, table 16-A-2 of FIG. 26, table 16-B-1 of FIG. 27, table 16-B-2 of FIG. 28, and a table of FIG. 29 which are the area mapping tables.

8. The data transmission method according to claim 2, wherein the n is a positive integer equal to or larger than 5, and the $2^{2n}$ signal points and 10 bits of the 2n-bit data are determined using table 16-D-1 of FIG. 30, table 16-D-2 of FIG. 31, table 16-B-1 of FIG. 27, table 16-B-2 of FIG. 28, and a table of FIG. 29 which are the area mapping tables.

9. The data transmission method according to claim 2, wherein the n is a positive integer equal to or larger than 5, and the $2^{2n}$ signal points and 10 bits of the 2n-bit data are determined using table 16-D-1 of FIG. 30, table 16-A-2 of FIG. 26, a table of FIG. 32, table 16-B-2 of FIG. 28, and a table of FIG. 29 which are the area mapping tables.

10. The data transmission method according to claim 7, wherein tables obtained by converting the four 2-bit patterns 00, 01, 10, 11 in the five individual area mapping tables using a conversion algorithm in which the Hamming distance between the adjacent areas is unchanged are used as area mapping tables.

11. A data transmission method of a $2^{2n+1}$ (n is a positive integer equal to or larger than two) QAM modulation scheme in which $2^{2n+1}$ signal points arranged in a cross shape are used to transmit 2n+1-bit data, the method comprising:

providing a first mapping table that divides a signal area including $2^{2n+1}$ signal points into a first plurality of areas and assigns 2 bits to each of the first plurality of areas in such a way that the bit values differ from each other between first adjacent areas, the first adjacent areas being included in the first plurality of areas, and a second area mapping table that divides a signal area including $2^{2n+1}$ signal points into a second plurality of areas and assigns 1 bit to each of the second plurality of areas in such a way that the bit value differs from each other between second adjacent areas, the second adjacent areas being included in the second plurality of areas; and dividing 2n+1-bit data into n 2-bit data and one 1-bit data and locating the signal points for the 2n+1-bit data to a common portion between a common portion among n signal areas obtained by referring, as to each of the n 2-bit data, to the n first area mapping tables among which divided areas differ in shape and an area determined by the second area mapping table in correspondence to the 1-bit data.

12. The data transmission method according to claim 11, wherein the $2^{2n+1}$ signal points and 5 bits of the 2n-bit data are determined using a table of FIG. 6, and table 5-C-2 of FIG. 8 which are the first area mapping tables and Table 5-C-1 of FIG. 8 which is the second area mapping table.

13. The data transmission method according to claim 12, wherein tables obtained by converting the four 2-bit patterns 00, 01, 10, 11 in the two individual first area mapping tables using a conversion algorithm in which a Hamming distance between the adjacent areas is unchanged are used as area mapping tables, and a table obtained by replacing the two 1-bit patterns 0, 1 in the one second area mapping table is used as an area mapping table.

14. A data transmission method of a $2^{2n+1}$ (n is a positive integer equal to or larger than two) QAM modulation scheme in which $2^{2n+1}$ signal points arranged in a circular shape are used to transmit 2n+1-bit data, the $2^{2n+1}$ signal points obtained by rearranging a part of $2^{2n+1}$ signal points arranged in a cross shape, the method comprising:

providing a first area mapping table that divides a signal area including $2^{2n+1}$ signal points into a first plurality of areas and assigns 2 bits to each of the first plurality of areas in such a way that the bit values differ from each other between first adjacent areas, the first adjacent areas being included in the first plurality of areas, and a second area mapping table that divides a signal area including $2^{2n+1}$ signal points into a second plurality of areas and assigns 1 bit to each of the second plurality of areas in such a way that the bit value differs from each other between second adjacent areas, the second adjacent areas being included in the second plurality of areas; and dividing 2n+1-bit data into n 2-bit data and one 1-bit data and locating the signal points for the 2n+1 data to a common portion between a common portion among n signal areas obtained by referring, as to each of the n 2-bit data, to the n first area mapping tables among which divided areas differ in shape and an area determined by the second area mapping table in correspondence to the 1-bit data.

15. The data transmission method according to claim 14, wherein
the n is a positive integer equal to or larger than 4, and
the $2^{2n+1}$ signal points and 9 bits of the 2n-bit data are determined using table 7-A-1 of FIG. 13, table 7-D-2 of FIG. 16, table 7-B-2 of FIG. 14, and a table of FIG. 15 which are the first area mapping tables and Table 7-D-1 of FIG. 16 which is the second area mapping table.

16. The data transmission method according to claim 14, wherein
the n is a positive integer equal to or larger than 4, and
the $2^{2n+1}$ signal points and 9 bits of the 2n-bit data are determined using table 7-A-1 of FIG. 13, table 7-B-1 of FIG. 14, table 7-B-2 of FIG. 14, and a table of FIG. 15 which are the first area mapping tables and table 7-A-2 of FIG. 13 which is the second area mapping table.

17. The data transmission method according to claim 15, wherein
tables obtained by converting the four 2-bit patterns 00, 01, 10, 11 in the four first individual area mapping tables using a conversion algorithm in which the Hamming distance between the adjacent areas is unchanged are used as area mapping tables, and
a table obtained by replacing the two 1-bit patterns 0, 1 in the one second area mapping table is used as an area mapping table.

18. A data reception method that uses a $2^{2n}$ (n is a positive integer equal to or larger than four) QAM modulation scheme in which $2^{2n}$ signal points arranged in a circular shape are used to transmit 2n-bit data, determines a correspondence between the 2n-bit data to be transmitted and the $2^{2n}$ signal points by the data transmission method defined by the method as claimed in claim 2 and calculates, from a received signal point, the 2n-bit data corresponding to a transmitted signal point closest to the received signal point, the method comprising:
acquiring n 2-bit data by referring to n area mapping tables identical to the n area mapping tables as claimed in claim 2 in correspondence to an area including the received signal point.

19. The data reception method according to claim 18, wherein
8 bits of the 2n-bit data corresponding to a transmitted signal point closest the received signal point are determined using table 6-A-1 of FIG. 9, table 6-A-2 of FIG. 9, table 6-B-1 of FIG. 10, and table 6-B-2 of FIG. 10 which are the area mapping tables.

20. The data reception method according to claim 18, wherein
8 bits of the 2n-bit data corresponding to a transmitted signal point closest to the received signal point are determined using table 6-C-1 of FIG. 11, table 6-C-2 of FIG. 11, table 6-B-1 of FIG. 10, and table 6-B-2 of FIG. 10 which are the area mapping tables.

21. The data reception method according to claim 18, wherein
8 bits of the 2n-bit data corresponding to a transmitted signal point closest to the received signal point are determined using table 6-C-1 of FIG. 11, table 6-A-2 of FIG. 9, a table of FIG. 12, and table 6-B-2 of FIG. 10 which are the area mapping tables.

22. The data reception method according to claim 19, wherein
tables obtained by converting the four 2-bit patterns 00, 01, 10, 11 in the four individual area mapping tables using a conversion algorithm in which the Hamming distance between the adjacent areas is unchanged are used as area mapping tables.

23. The data reception method according to claim 18, wherein
the n is a positive integer equal to or larger than 5, and
10 bits of the 2n-bit data corresponding to a transmitted signal point closest to the received signal point are determined using table 16-A-1 of FIG. 25, table 16-A-2 of FIG. 26, table 16-B-1 of FIG. 27, table 16-B-2 of FIG. 28, and a table of FIG. 29 which are the area mapping tables.

24. The data reception method according to claim 18, wherein
the n is a positive integer equal to or larger than 5, and
10 bits of the 2n-bit data corresponding to a transmitted signal point closest to the received signal point are determined using table 16-D-1 of FIG. 30, table 16-D-2 of FIG. 31, table 16-B-1 of FIG. 27, table 16-B-2 of FIG. 28, and a table of FIG. 29 which are the area mapping tables.

25. The data reception method according to claim 18, wherein
the n is a positive integer equal to or larger than 5, and
10 bits of the 2n-bit data corresponding to a transmitted signal point closest to the received signal point are determined using table 16-D-1 of FIG. 30, table 16-A-2 of FIG. 26, a table of FIG. 32, table 16-B-2 of FIG. 28, and a table of FIG. 29 which are the area mapping tables.

26. The data reception method according to claim 23, wherein
tables obtained by converting the four 2-bit patterns 00, 01, 10, 11 in the five individual area mapping tables using a conversion algorithm in which the Hamming distance between the adjacent areas is unchanged are used as area mapping tables.

27. A data reception method that uses a $2^{2n+1}$ (n is a positive integer equal to or larger than two) QAM modulation scheme in which $2^{2n+1}$ signal points arranged in a cross shape are used to transmit 2n+1-bit data, determines a correspondence between the 2n+1-bit data to be transmitted and the $2^{2n+1}$ signal points by the data transmission method defined by the method as claimed in claim 11 and calculates, from a received signal point, the 2n+1-bit data corresponding to a transmitted signal point closest to the received signal point, the method comprising:
acquiring n 2-bit data by referring to the n 2-bit area mapping tables as claimed in claim 11 in correspondence to an area including the received signal point, and 1 bit by referring to a 1-bit area mapping table.

28. The data reception method according to claim 27, wherein
5 bits of the 2n+1-bit data corresponding to a transmitted signal point closest to the received signal point are determined using a table of FIG. 6, and table 5-C-2 of FIG. 8 which are the 2-bit area mapping tables and table 5-C-1 of FIG. 8 which is one 1-bit area mapping table.

29. The data reception method according to claim 28, wherein
tables obtained by converting the four 2-bit patterns 00, 01, 10, 11 in the two individual 2-bit area mapping tables using a conversion algorithm in which a Hamming distance between the adjacent areas is unchanged are used as area mapping tables, and
a table obtained by replacing the two 1-bit patterns 0, 1 in the one 1-bit area mapping table is used as an area mapping table.

30. A data reception method that uses a $2^{2n+1}$ (n is a positive integer equal to or larger than two) QAM modulation scheme in which $2^{2n+1}$ signal points arranged in a circular shape are used to transmit 2n+1-bit data, the $2^{2n+1}$ signal points being obtained by rearranging a part of the $2^{2n+1}$ signal points arranged in a cross shape, determines a correspondence between the 2n+1-bit data to be transmitted and the $2^{2n+1}$ signal points by the data transmission method defined by the method as claimed in claim 14 and calculates, from a received signal point, the 2n+1-bit data corresponding to a transmitted signal point closest to the received signal point, the method comprising:
acquiring n 2-bit data by referring to n 2-bit area mapping tables as claimed in claim 14 in correspondence to an area including the received signal point, and 1 bit by referring to a 1-bit area mapping table.

31. The data reception method according to claim 30, wherein
the n is a positive integer equal to or larger than 4, and
9 bits of the 2n+1-bit data corresponding to a transmitted signal point closest to the received signal point are determined using table 7-A-1 of FIG. 13, table 7-D-2 of FIG. 16, table 7-B-2 of FIG. 14, and a table of FIG. 15 which are the 2-bit area mapping tables and table 7-D-1 of FIG. 16 which is the one 1-bit area mapping table.

32. The data reception method according to claim 24, wherein
the n is a positive integer equal to or larger than 4, and
9 bits of the 2n+1-bit data corresponding to a transmitted signal point closest the received signal point are determined using table 7-A-1 of FIG. 13, table 7-B-1 of FIG. 14, table 7-B-2 of FIG. 14, and a table of FIG. 15 which are the 2-bit area mapping tables and table 7-A-2 of FIG. 13 which is the 1-bit area mapping table.

33. The data reception method according to claim 31, wherein
tables obtained by converting the four 2-bit patterns 00, 01, 10, 11 in the four individual 2-bit area mapping tables using a conversion algorithm in which a Hamming distance between the adjacent areas is unchanged are used as area mapping tables, and
a table obtained by replacing the two 1-bit patterns 0, 1 in the one 1-bit area mapping table is used as an area mapping table.

34. A modulation device of a $2^{2n}$ (n is a positive integer equal to or larger than four) QAM modulation scheme in which $2^{2n}$ signal points arranged in a circular shape are used to transmit 2n-bit data, the $2^{2n}$ signal points being obtained by rearranging a part of the $2^{2n}$ signal points arranged in a rectangular shape, the device comprising:
a first relating section that relates a first 2n-bit pattern whose lower 2t (t is a positive integer smaller than n) bits and upper 2(n−t) bits have been independently subjected to the gray code, to first signal points coinciding with the rectangular arrangement; and
a second relating section that relates a second 2n-bit pattern to each of second signal points rearranged into the circular shape in such a way that an average Hamming distance between the adjacent signal points in terms of the lower 2t-bit portion is minimum and the Euclidean distance between signal points at which the lower 2t-bit portions assigned thereto coincide with each other is maximum, the second 2n-bit pattern being among all 2n-bit patterns excluding the first 2n-bit patterns related to the first signal points.

35. A modulation device of a $2^{2n}$ (n is a positive integer equal to or larger than four) QAM modulation scheme in which $2^{2n}$ signal points arranged in a circular shape are used to transmit 2n-bit data, the $2^{2n}$ signal points being obtained by rearranging a part of the $2^{2n}$ signal points arranged in a rectangular shape, the device comprising:
n types of area mapping tables for each dividing a signal area including $2^{2n}$ signal points into a plurality of areas, each assigning 2 bits to each of first divided areas included in the rectangular arrangement by applying gray code that a Hamming distance between first adjacent areas differs by 1, the first divided areas being included in the plurality of areas and the first adjacent areas being included in the first divided areas, and each assigning 2 bits to each of second divided areas not included in the rectangular arrangement in such a way that an average Hamming distance between second adjacent areas becomes minimum, the second divided areas being included in the plurality of areas and the second adjacent areas being included in the second divided areas; and
a setting section that divides the 2n-bit data into n 2-bit data and locates the signal point for the 2n-bit data to a common portion among n signal areas obtained by referring, as to each of the n 2-bit data, to the n area mapping tables among which the divided areas differ in shape.

36. A modulation device of a $2^{2n+1}$ (n is a positive integer equal to or larger than two) QAM modulation scheme in which $2^{2n+1}$ signal points arranged in a cross shape are used to transmit 2n+1-bit data, the device comprising:
a first area mapping table that divides a signal area including $2^{2n+1}$ signal points into a first plurality of areas and assigns 2 bits to each of the first plurality of areas in such a way that the bit values differ from each other between adjacent areas, the first adjacent areas being included in the first plurality of areas, and a second area mapping table that divides a signal area including $2^{2n+1}$ signal points into a second plurality of areas and assigning 1 bit to each of the second plurality of areas in such a way that the bit value differs from each other between second adjacent areas, the second adjacent areas being included in the second plurality of areas; and
a setting section that divides 2n+1-bit data into n 2-bit data and one 1-bit data and locates the signal points for the 2n+1-bit data to a common portion between a common portion among n signal areas obtained by referring, as to each of the n 2-bit data, to the n first area mapping tables among which divided areas differ in shape and an area determined by the second area mapping table in correspondence to the 1-bit data.

37. A modulation device of a $2^{2n+1}$ (n is a positive integer equal to or larger than two) QAM modulation scheme in which $2^{2n+1}$ signal points arranged in a circular shape are used to transmit 2n+1-bit data, the $2^{2n+1}$ signal points obtained by rearranging a part of $2^{2n+1}$ signal points arranged in a cross shape, the device comprising:
- a first area mapping table that divides a signal area including $2^{2n+1}$ signal points into a first plurality of areas and assigns 2 bits to each of the first plurality of areas in such a way that the bit values differ from each other between first adjacent areas, the first adjacent areas being included in the first plurality of areas, and a second area mapping table that divides a signal area including $2^{2n+1}$ signal points into a second plurality of areas and assigns 1 bit to each of the second plurality of areas in such a way that the bit value differs from each other between second adjacent areas, the second adjacent areas being included in the second plurality of areas; and
- a setting section that divides 2n+1-bit data into n 2-bit data and one 1-bit data and locates the signal points for the 2n+1 data to a common portion between a common portion among n signal areas obtained by referring, as to each of the n 2-bit data, to the n first area mapping tables among which divided areas differ in shape and an area determined by the second area mapping table in correspondence to the 1-bit data.

38. A demodulation device that uses a $2^{2n}$ (n is a positive integer equal to or larger than four) QAM modulation scheme in which $2^{2n}$ signal points arranged in a circular shape are used to transmit 2n-bit data, the device comprising:
- a calculation section that determines a correspondence between the 2n-bit data to be transmitted and the $2^{2n}$ signal points by the data transmission method defined by the method as claimed in claim 2 and calculates, from a received signal point, the 2n-bit data corresponding to a transmitted signal point closest to the received signal point; and
- an acquisition section that acquires n 2-bit data by referring to n area mapping tables identical to the n area mapping tables as claimed in claim 2 in correspondence to an area including the received signal point.

39. A demodulation device that uses a $2^{2n+1}$ (n is a positive integer equal to or larger than two) QAM modulation scheme in which $2^{2n+1}$ signal points arranged in a cross shape are used to transmit 2n+1-bit data, the device comprising:
- a calculation section that, determines a correspondence between the 2n+1-bit data to be transmitted and the $2^{2n+1}$ signal points by the data transmission method defined by the method as claimed in claim 11 and calculates, from a received signal point, the 2n+1-bit data corresponding to a transmitted signal point closest to the received signal point, and
- an acquisition section that acquires n 2-bit data by referring to n 2-bit area mapping tables as claimed in claim 11 in correspondence to an area including the received signal point, and 1 bit by referring to a 1-bit area mapping table.

40. A demodulation device that uses a $2^{2n+1}$ (n is a positive integer equal to or larger than two) QAM modulation scheme in which $2^{2n+1}$ signal points arranged in a circular shape are used to transmit 2n+1-bit data, the $2^{2n+1}$ signal points being obtained by rearranging a part of the $2^{2n+1}$ signal points arranged in a cross shape, the device comprising:
- a calculation section that determines a correspondence between the 2n+1-bit data to be transmitted and the $2^{2n+1}$ signal points by the data transmission method defined by the method as claimed in claim 14 and calculates, from a received signal point, the 2n+1-bit data corresponding to a transmitted signal point closest to the received signal point, and an acquisition section that acquires n 2-bit data by referring to n 2-bit area mapping tables as claimed in claim 14 in correspondence to an area including the received signal point, and 1 bit by referring to a 1-bit area mapping table.

* * * * *